US011855227B2

(12) United States Patent
Yamaguchi

(10) Patent No.: US 11,855,227 B2
(45) Date of Patent: Dec. 26, 2023

(54) SOLID-STATE IMAGE PICKUP UNIT AND ELECTRONIC APPARATUS

(71) Applicant: SONY SEMICONDUCTOR SOLUTIONS CORPORATION, Kanagawa (JP)

(72) Inventor: Tetsuji Yamaguchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/747,268

(22) Filed: May 18, 2022

(65) Prior Publication Data

US 2022/0278237 A1    Sep. 1, 2022

Related U.S. Application Data

(63) Continuation of application No. 17/068,807, filed on Oct. 12, 2020, now Pat. No. 11,367,794, which is a
(Continued)

(30) Foreign Application Priority Data

Jan. 16, 2013  (JP) ................................ 2013-005274

(51) Int. Cl.
  *H01L 29/786*   (2006.01)
  *H01L 27/146*   (2006.01)
(Continued)

(52) U.S. Cl.
  CPC .... *H01L 29/7869* (2013.01); *H01L 27/14603* (2013.01); *H01L 27/14609* (2013.01);
(Continued)

(58) Field of Classification Search
  CPC ......... H01L 27/44665; H01L 27/14612; H01L 29/7869
  See application file for complete search history.

(56) References Cited

U.S. PATENT DOCUMENTS 9,954,018 B2   4/2018  Yamaguchi
10,008,524 B2  6/2018  Yamaguchi
(Continued)

FOREIGN PATENT DOCUMENTS

CN    101964352    2/2011
CN    102097443    6/2011
(Continued)

OTHER PUBLICATIONS

International Search Report for International (PCT) Patent Application No. PCT/JP2013/084053, dated Mar. 4, 2014, 2 pages.
(Continued)

*Primary Examiner* — Thanh Luu
(74) *Attorney, Agent, or Firm* — Sheridan Ross PC

(57) ABSTRACT

A solid-state image pickup unit includes: a substrate made of a first semiconductor; a substrate made of a first semiconductor; a photoelectric conversion device provided on the substrate and including a first electrode, a photoelectric conversion layer, and a second electrode in order from the substrate; and a plurality of field-effect transistors configured to perform signal reading from the photoelectric conversion device. The plurality of transistors include a transfer transistor and an amplification transistor, the transfer transistor includes an active layer containing a second semiconductor with a larger band gap than that of the first semiconductor, and one terminal of a source and a drain of the transfer transistor also serves the first electrode or the second electrode of the photoelectric conversion device, and the other terminal of the transfer transistor is connected to a gate of the amplification transistor.

17 Claims, 17 Drawing Sheets

Related U.S. Application Data continuation of application No. 16/056,139, filed on Aug. 6, 2018, now Pat. No. 10,833,110, which is a continuation of application No. 15/581,317, filed on Apr. 28, 2017, now Pat. No. 10,074,697, which is a continuation of application No. 15/581,128, filed on Apr. 28, 2017, now Pat. No. 10,008,524, which is a continuation of application No. 14/759,734, filed as application No. PCT/JP2013/084053 on Dec. 19, 2013, now Pat. No. 9,954,018.

(51) Int. Cl.
| | |
|---|---|
| H01L 29/24 | (2006.01) |
| H01L 29/16 | (2006.01) |
| H04N 25/63 | (2023.01) |
| H04N 25/70 | (2023.01) |
| H04N 25/76 | (2023.01) |
| H04N 25/13 | (2023.01) |
| H10K 19/20 | (2023.01) |
| H10K 39/32 | (2023.01) |

(52) U.S. Cl.
CPC ......... *H01L 27/14612* (2013.01); *H01L 27/14621* (2013.01); *H01L 27/14623* (2013.01); *H01L 27/14636* (2013.01); *H01L 27/14645* (2013.01); *H01L 27/14665* (2013.01); *H01L 29/16* (2013.01); *H01L 29/24* (2013.01); *H04N 25/134* (2023.01); *H04N 25/63* (2023.01); *H04N 25/70* (2023.01); *H04N 25/76* (2023.01); *H10K 19/20* (2023.02); *H10K 39/32* (2023.02)

(56) References Cited

U.S. PATENT DOCUMENTS

| | | | |
|---|---|---|---|
| 10,074,697 | B2 | 9/2018 | Yamaguchi |
| 10,833,110 | B2 | 11/2020 | Yamaguchi |
| 2006/0044561 | A1 | 3/2006 | Nii |
| 2009/0293956 | A1 | 12/2009 | Kitamura |
| 2010/0053406 | A1 | 3/2010 | Ota |
| 2011/0019042 | A1 | 1/2011 | Yamaguchi |
| 2011/0115003 | A1 | 5/2011 | Okita et al. |
| 2011/0216212 | A1* | 9/2011 | Watanabe ............ H04N 23/73 257/292 |
| 2013/0113060 | A1 | 5/2013 | Matsunaga |
| 2021/0028206 | A1 | 1/2021 | Yamaguchi |

FOREIGN PATENT DOCUMENTS

| | | |
|---|---|---|
| JP | 2006-261402 | 9/2006 |
| JP | 2010-080953 | 4/2010 |
| JP | 2011-029337 | 2/2011 |
| JP | 2011-119711 | 6/2011 |
| JP | 2011-129873 | 6/2011 |
| JP | 2011-187544 | 9/2011 |
| JP | 2011199253 A | 10/2011 |
| JP | 2012-009910 | 1/2012 |
| JP | 2013-243355 | 12/2013 |
| KR | 10-2011-0055393 | 5/2011 |
| KR | 20110076769 A | 7/2011 |
| KR | 10-2012-0091294 | 8/2012 |

OTHER PUBLICATIONS

Official Action (with English translation) for Chinese Patent Application No. 201380069737.2 dated Apr. 1, 2017, 12 pages.
Official Action (no English translation available) for Japanese Patent Application No. 2014-557368 dated Mar. 28, 2017, 7 pages.
Official Action (with English translation) for Chinese Patent Application No. 201710421752.9, dated Feb. 3, 2020, 17 pages.
Official Action (with English translation) for Korean Patent Application No. 10-2015-7015014, dated Feb. 14, 2020, 14 pages.
Official Action for U.S. Appl. No. 14/759,734, dated Dec. 13, 2018, 11 pages.
Official Action for U.S. Appl. No. 15/581,128, dated Nov. 2, 2017, 10 pages.
Notice of Allowance for U.S. Appl. No. 15/581,128, dated Feb. 13, 2018, 7 pages.
Official Action for U.S. Appl. No. 15/581,317, dated Nov. 29, 2017, 10 pages.
Notice of Allowance for U.S. Appl. No. 15/581,317, dated May 15, 2018, 5 pages.
Official Action for U.S. Appl. No. 16/056,139, dated Feb. 13, 2020, 5 pages.
Notice of Allowance for U.S. Appl. No. 16/056,139, dated Jul. 8, 2020, 5 pages.
Official Action for U.S. Appl. No. 17/068,807, dated Sep. 23, 2021, 7 pages.
Notice of Allowance for U.S. Appl. No. 17/068,807, dated Feb. 17, 2022, 5 pages.
Notice of Allowance for U.S. Appl. No. 17/068,807, dated Mar. 22, 2022, 2 pages.

* cited by examiner

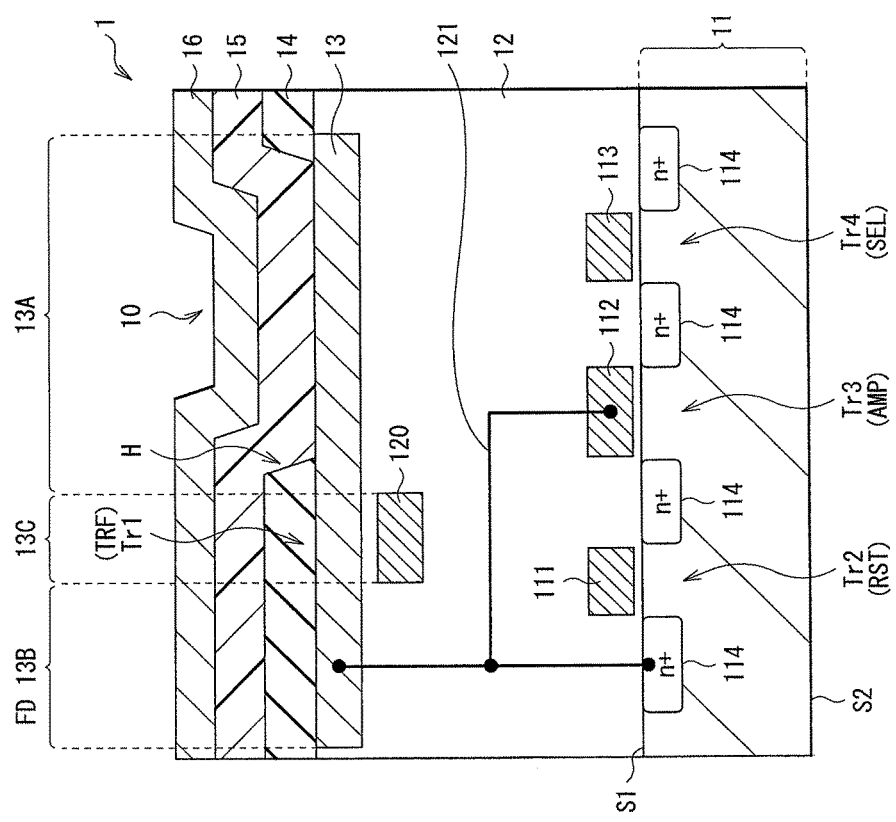
[FIG. 1]

[FIG. 2]
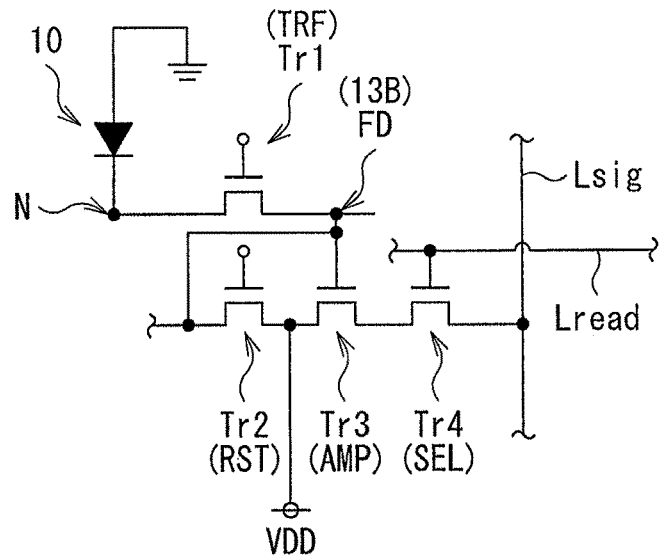
[FIG. 3]
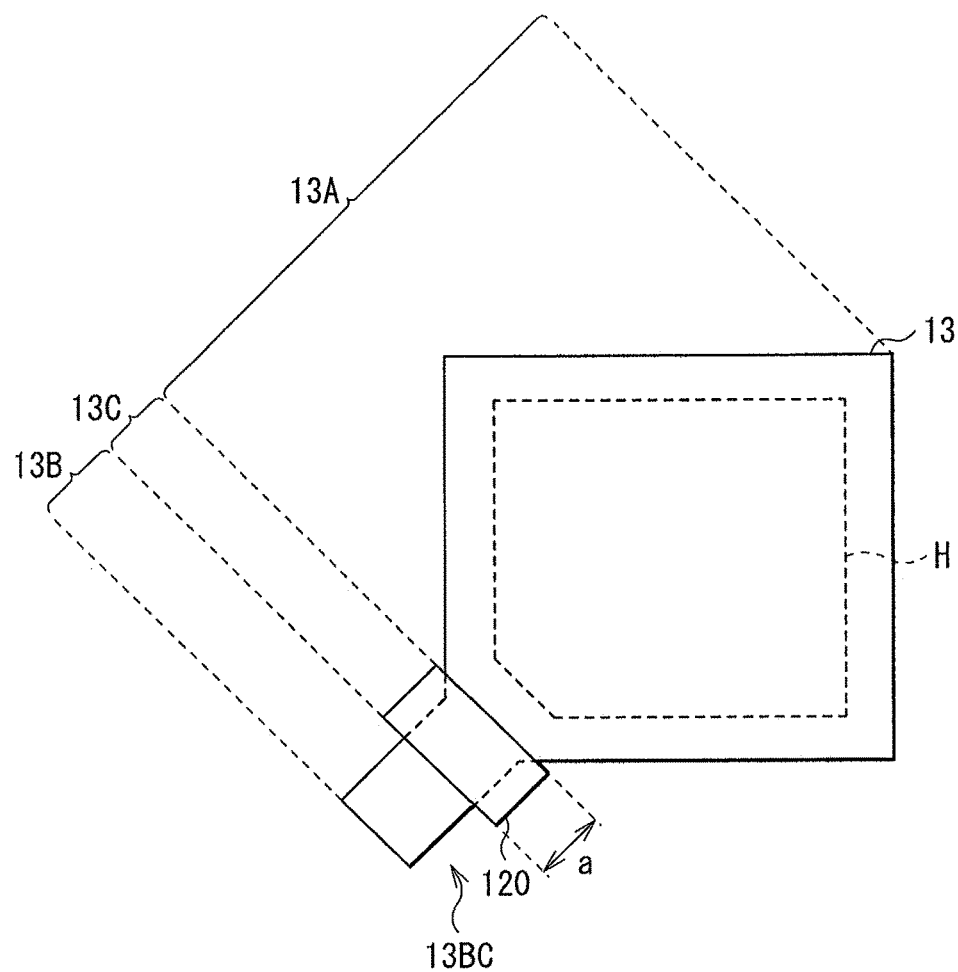

[ FIG. 4A ]
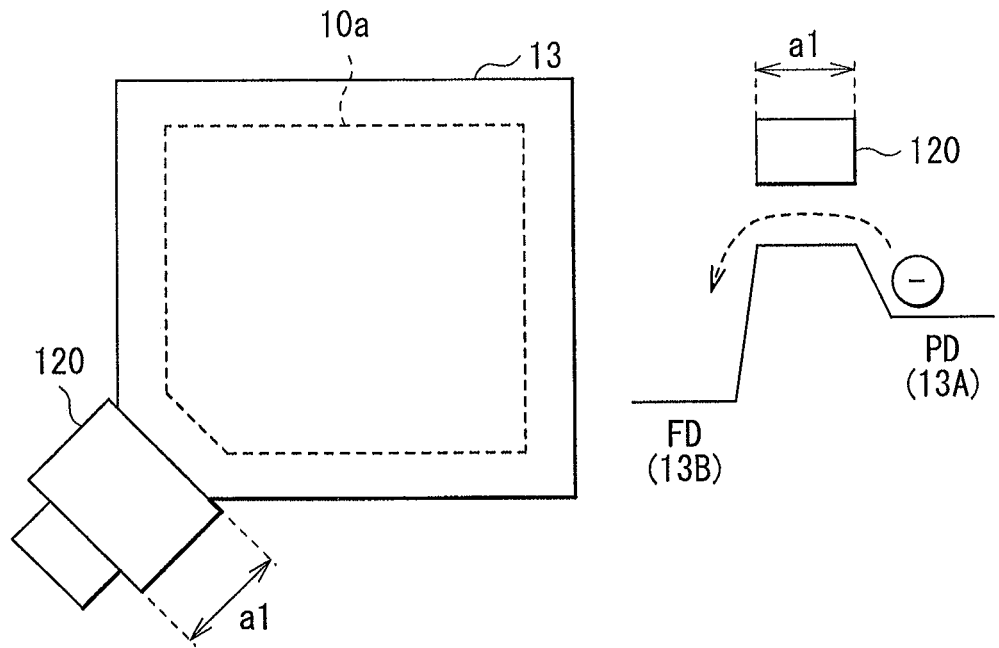
[ FIG. 4B ]
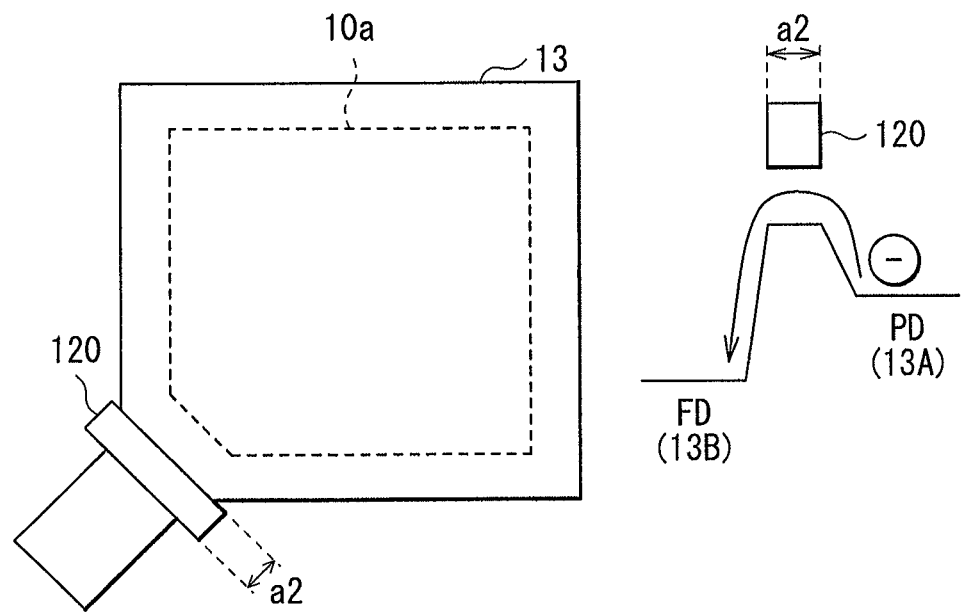

[ FIG. 5 ]
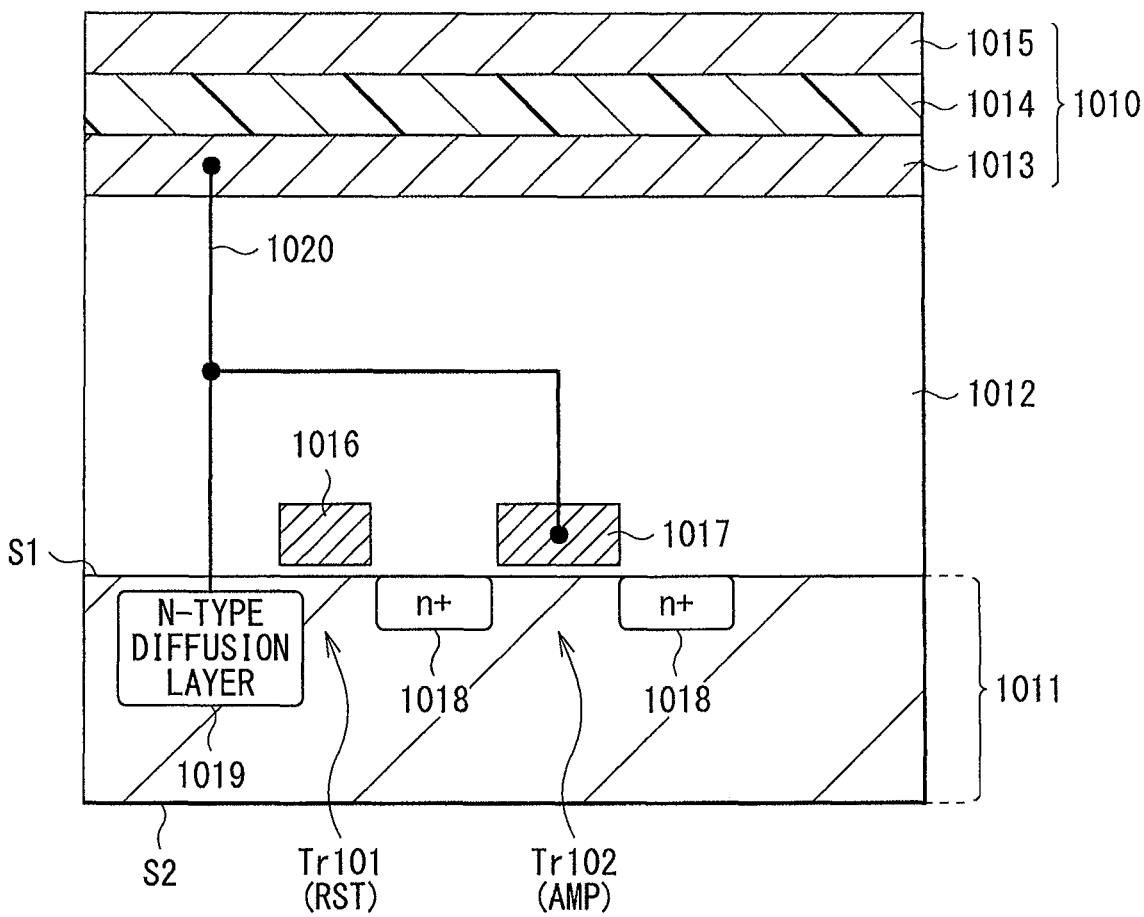
[ FIG. 6 ]
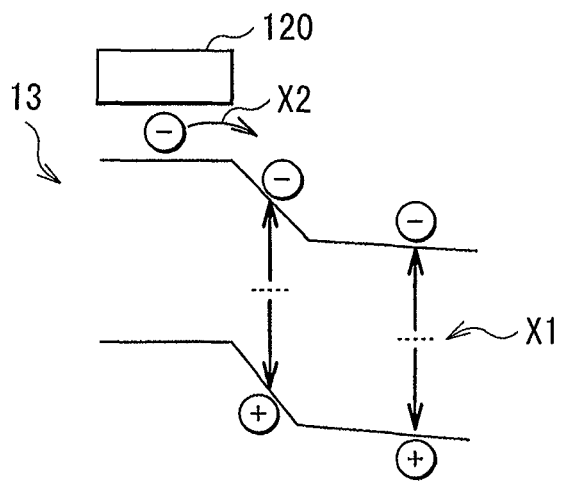

[ FIG. 7 ]
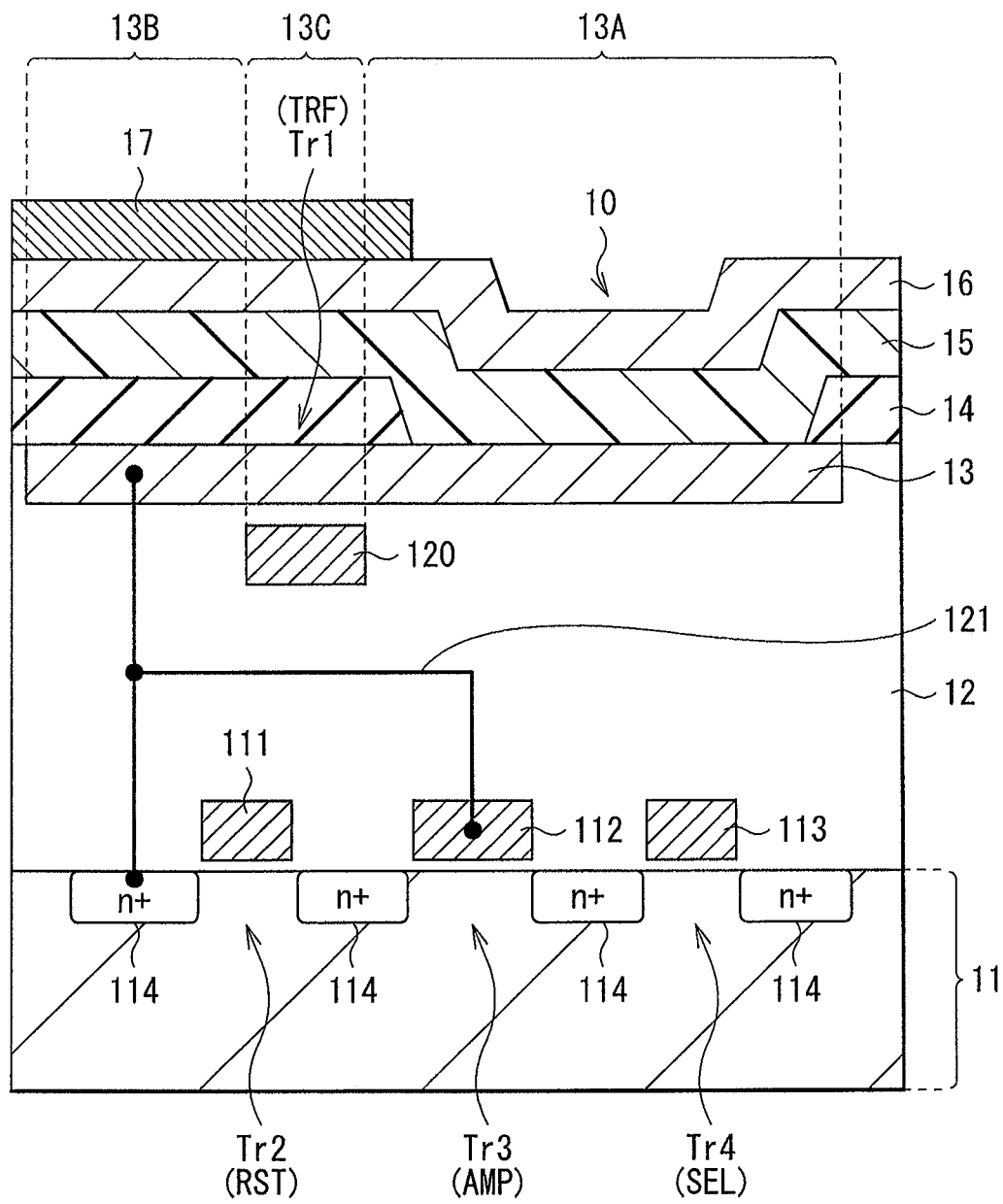

[ FIG. 8 ]
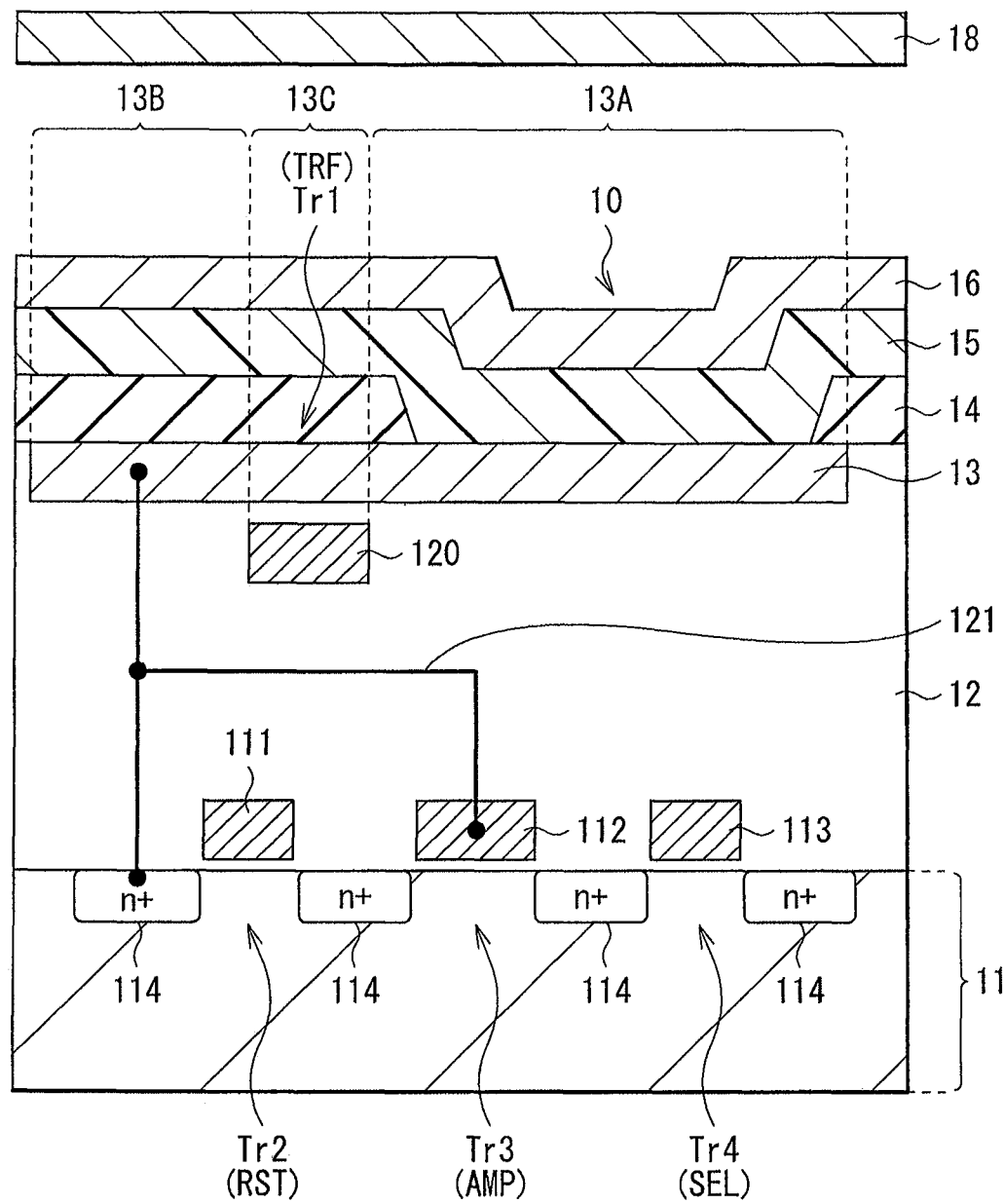

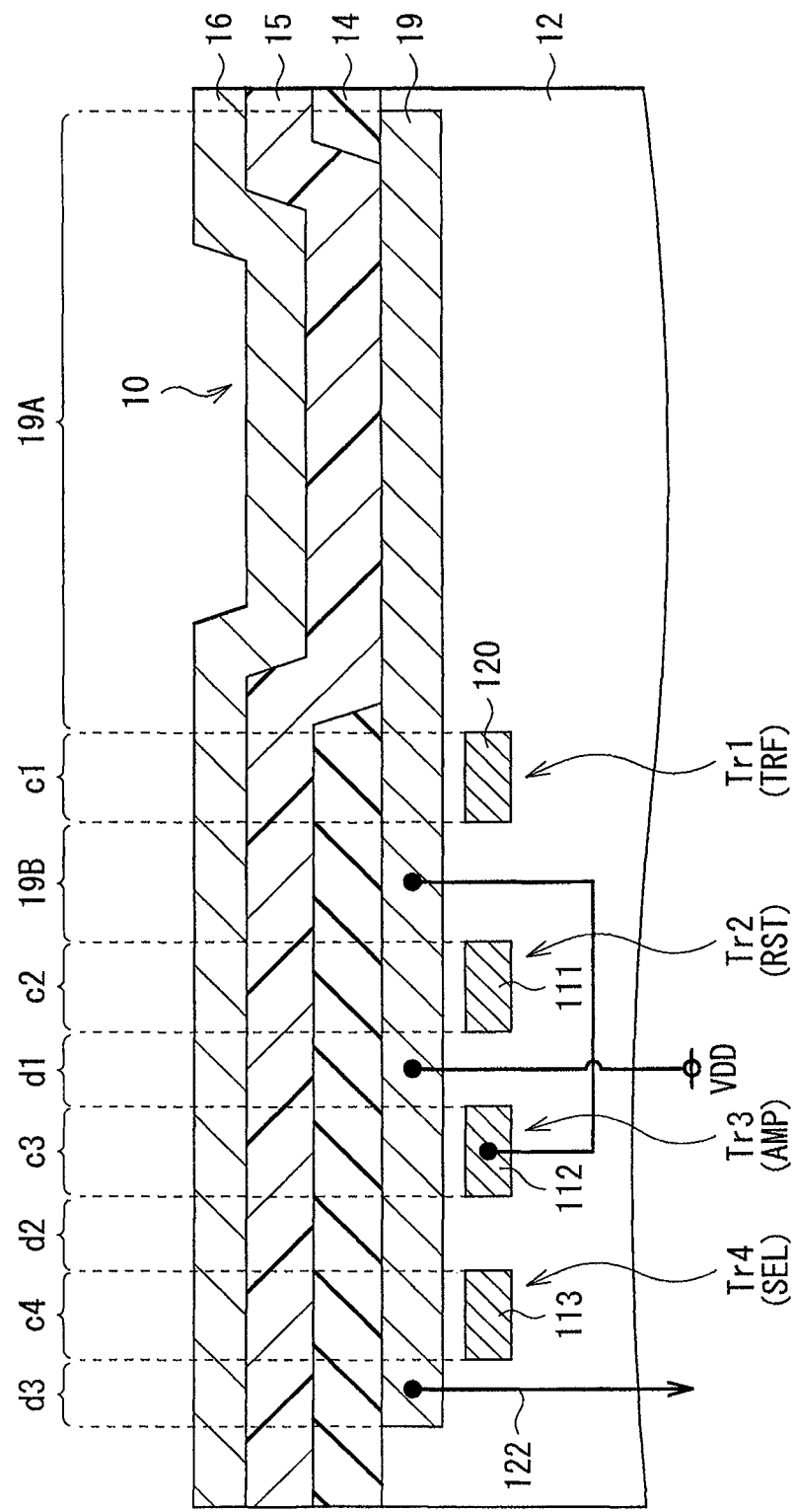
[ FIG. 9 ]

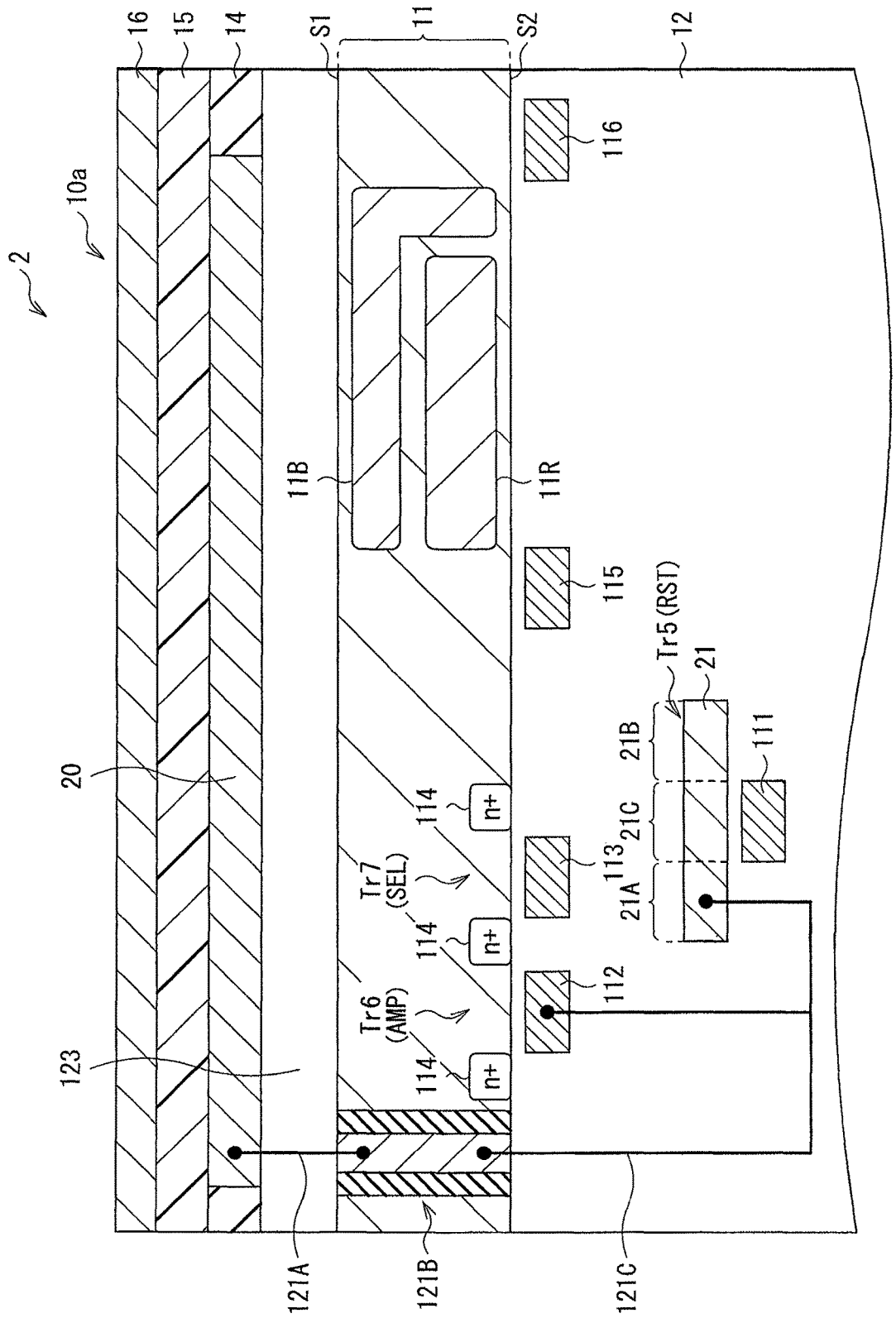

[ FIG. 11 ]
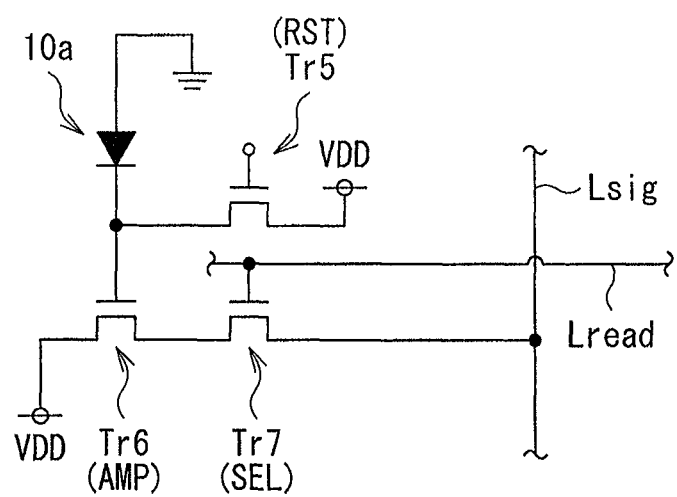

[ FIG. 12 ]
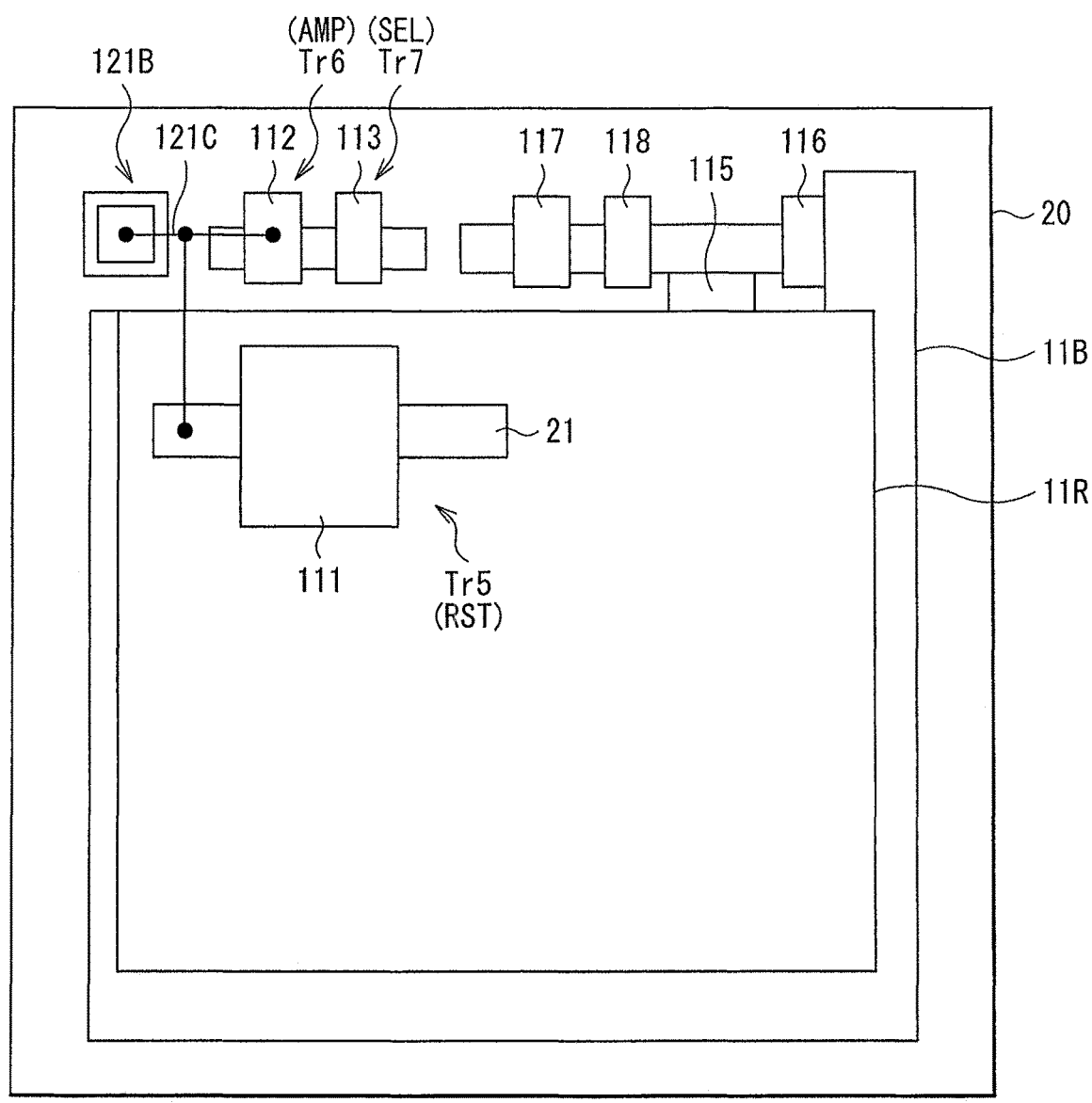

[ FIG. 13 ]
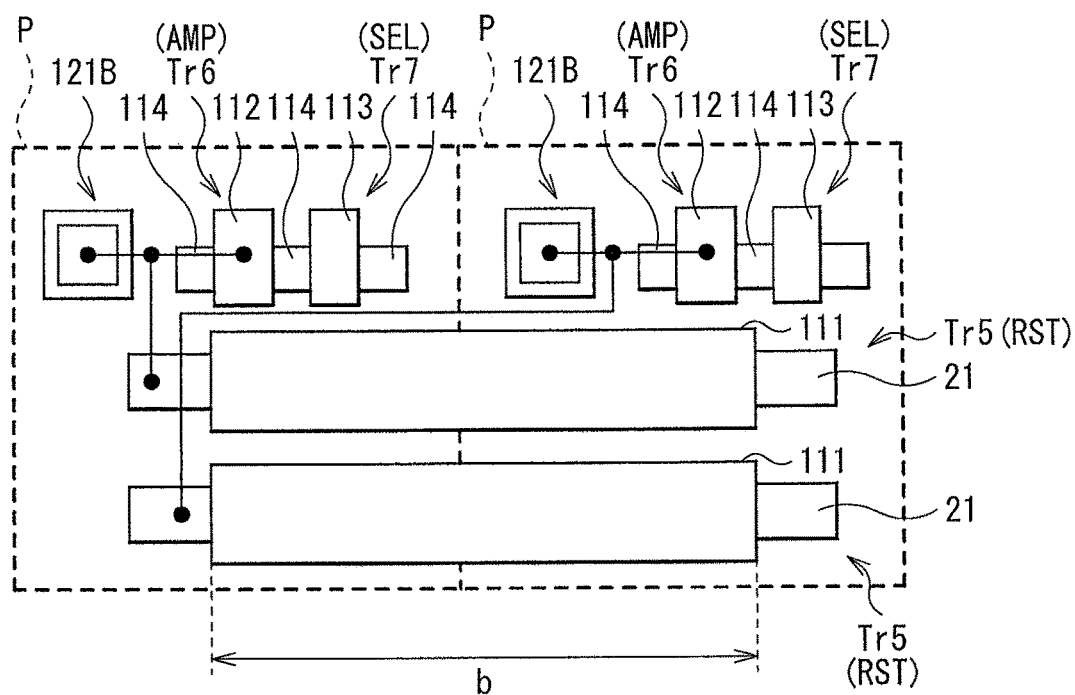

[ FIG. 14 ]
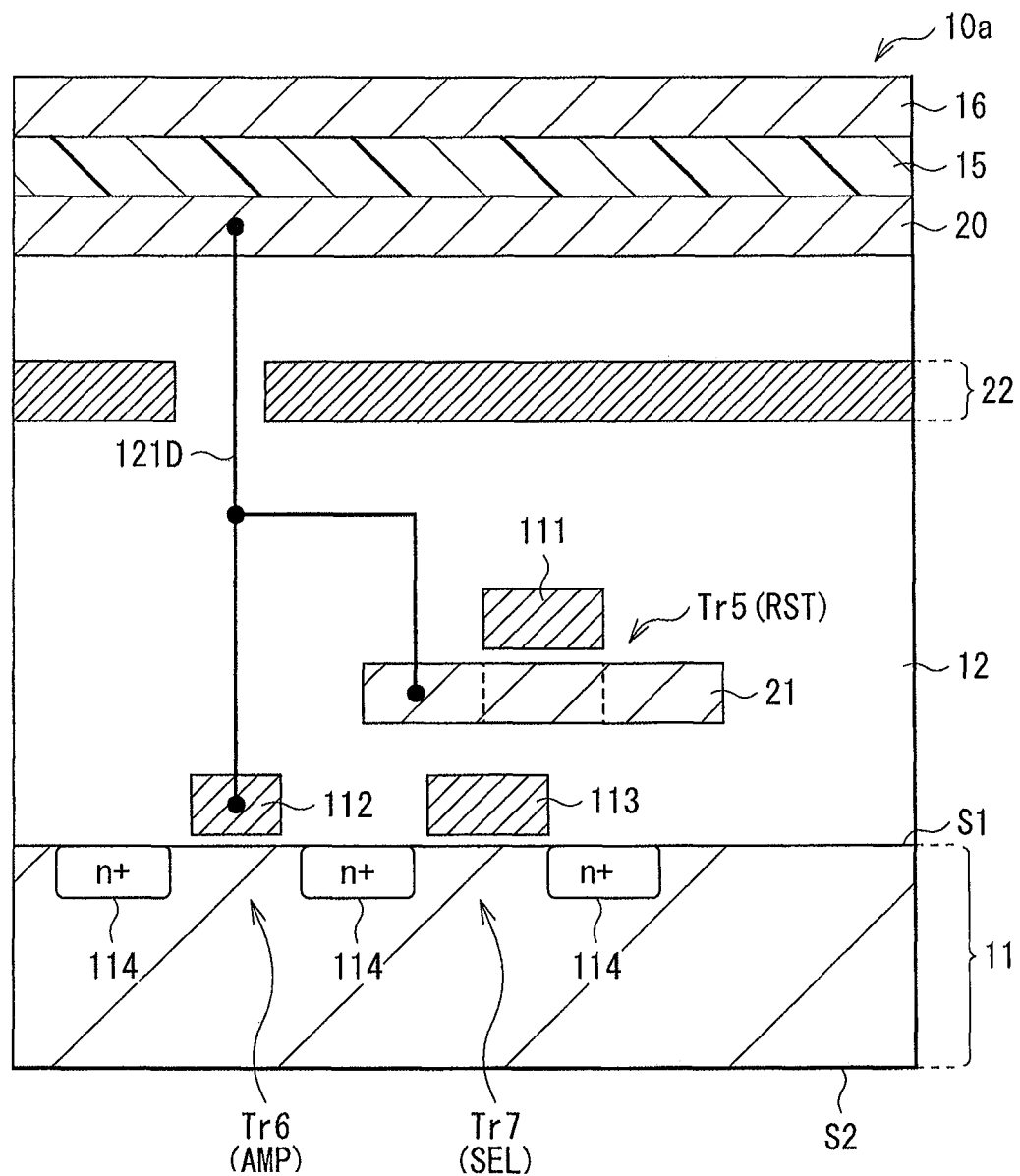

[ FIG. 15 ]
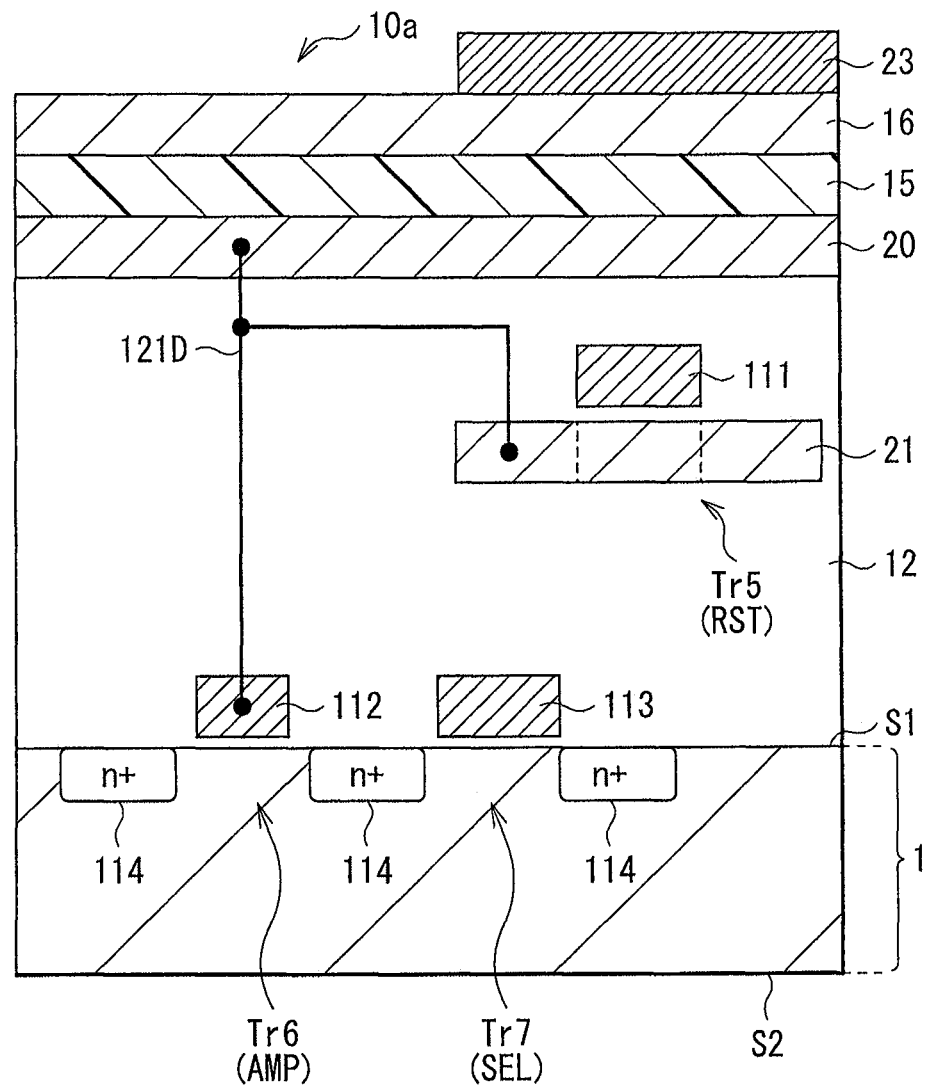

[FIG. 16]
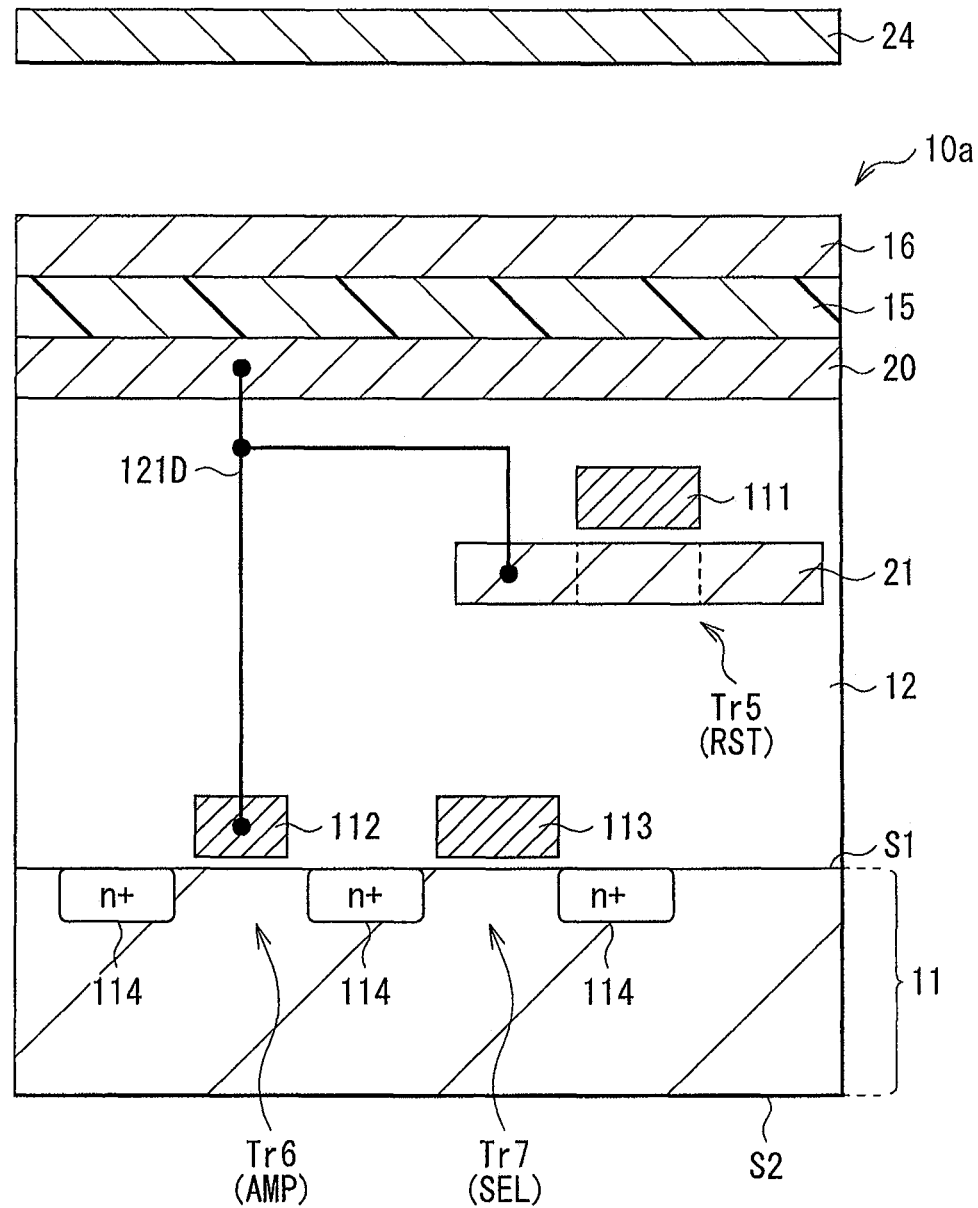

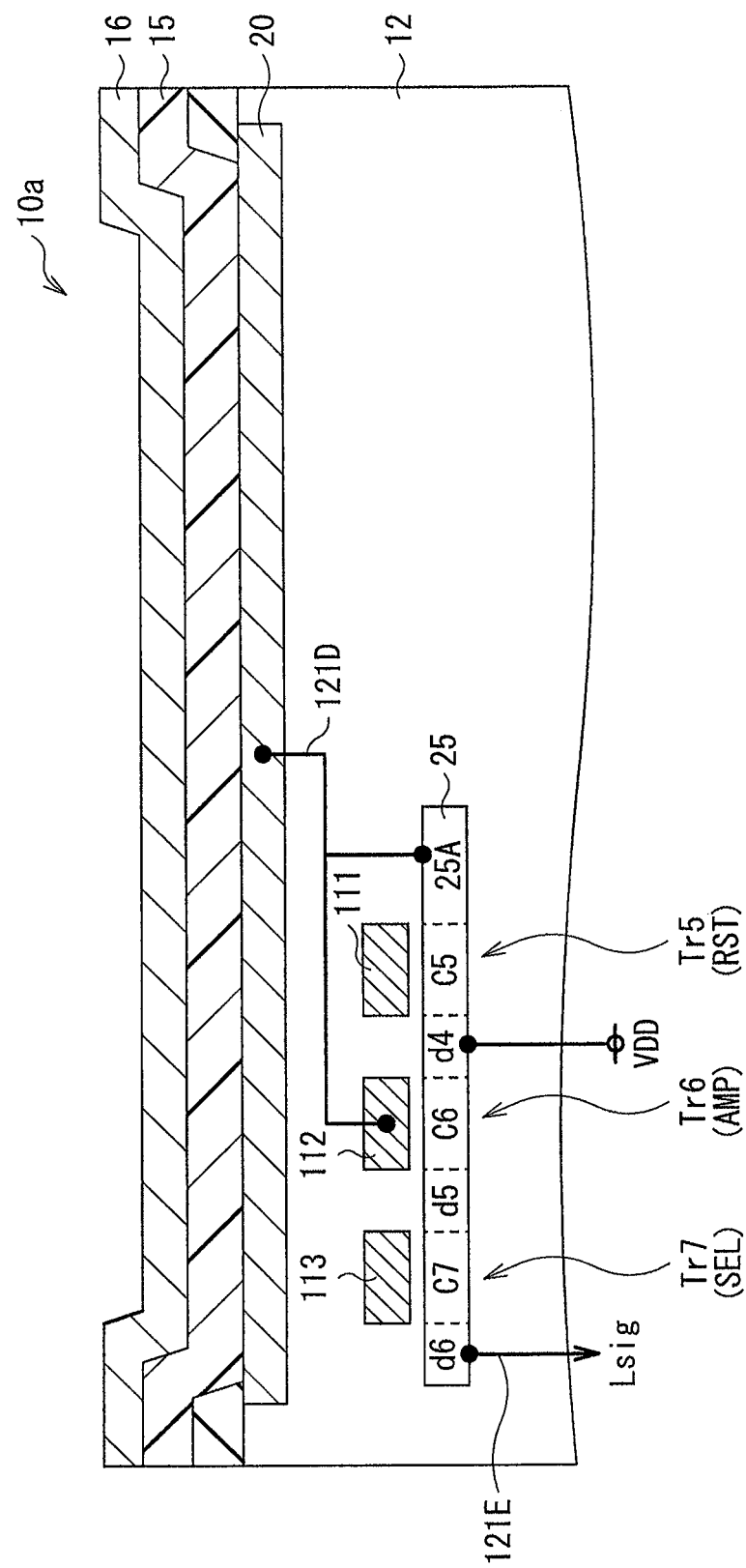
[ FIG. 17 ]

[ FIG. 18 ]
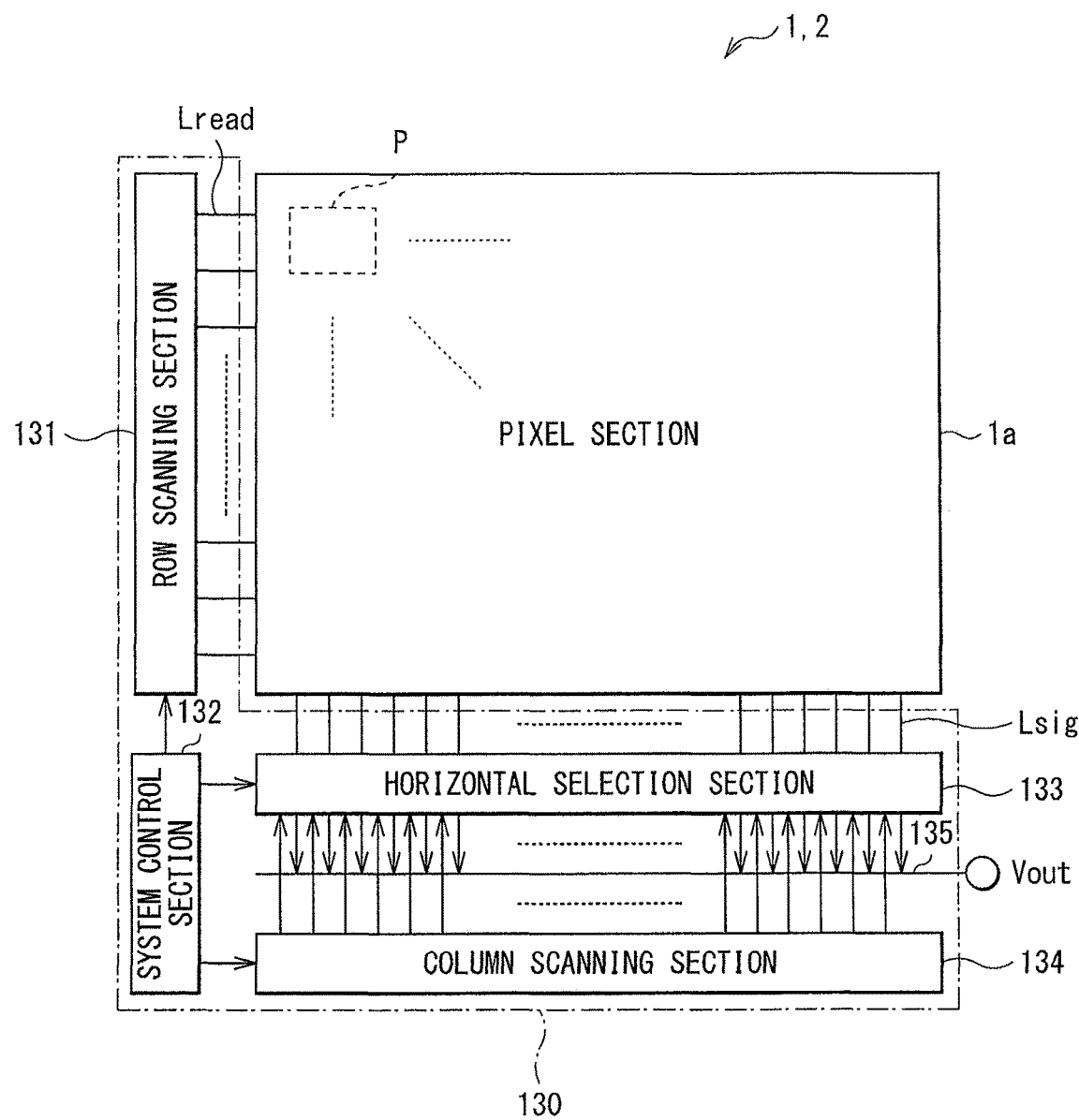

[ FIG. 19 ]
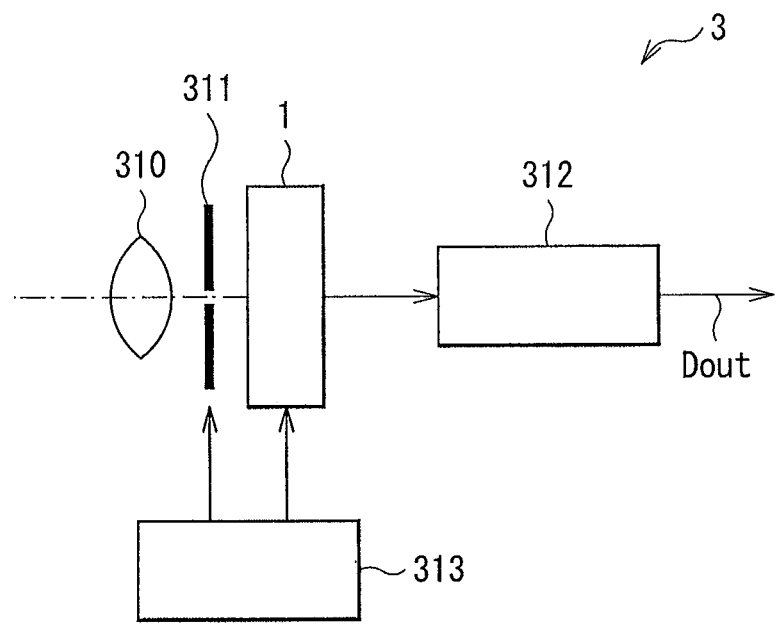

SOLID-STATE IMAGE PICKUP UNIT AND ELECTRONIC APPARATUS

CROSS REFERENCE TO RELATED APPLICATIONS

This application is a continuation of U.S. patent application Ser. No. 17/068,807, filed Oct. 12, 2020, which is a continuation of U.S. patent application Ser. No. 16/056,139, filed Aug. 6, 2018, now U.S. Pat. No. 10,833,110, which is a continuation of Ser. No. 15/581,317, filed Apr. 28, 2017, now U.S. Pat. No. 10,074,697, which is a continuation of U.S. patent application Ser. No. 15/581,128, filed Apr. 28, 2017, now U.S. Pat. No. 10,008,524, which is a continuation of U.S. patent application Ser. No. 14/759,734, filed Jul. 8, 2015, now U.S. Pat. No. 9,954,018, which is a national stage application under 35 U.S.C. 371 and claims the benefit of PCT Application No. PCT/JP2013/084053 having an international filing date of Dec. 19, 2013, which designated the United States, which PCT application claimed the benefit of Japanese Patent Application No. 2013-005274, filed Jan. 16, 2013, the entire disclosures of which are incorporated herein by reference.

TECHNICAL FIELD

The present disclosure relates to a laminated solid-state image pickup unit including, for example, a photoelectric conversion device on a semiconductor substrate, and an electronic apparatus.

BACKGROUND ART

In recent years, in solid-state image pickup units such as CCDs (Charge Coupled Devices) and CMOS (Complementary Metal Oxide Semiconductor) image sensors, the number of photons entering a pixel is reduced with reduction in pixel size, and reduction in sensitivity is concerned accordingly. Therefore, a so-called laminated solid-state image pickup unit is adopted as a solid-state image pickup unit that makes it possible to achieve an improvement in sensitivity. In the laminated solid-state image pickup unit, an aperture ratio of a photoelectric conversion region is allowed to be increased by forming a photoelectric conversion layer above a semiconductor substrate made of silicon or the like.

On the other hand, a longitudinal spectral solid-state image pickup unit in which photodiodes of respective colors R, G, and B are longitudinally laminated has been proposed, and in this configuration, respective color signals of R, G, and B are allowed to be obtained without using a color filter. Therefore, light loss caused by the color filter is eliminated, and almost entire entered light is allowed to be used for photoelectric conversion, thereby improving image quality. In particular, a configuration in which a photoelectric conversion layer different from silicon is formed above a silicon substrate is attracting attention as this longitudinal spectral solid-state image pickup unit. This configuration makes it possible to improve color separation characteristics, compared to a case where all of photodiodes of R, G, and B are formed in a silicon substrate.

However, a typical buried photodiode configuration used when photoelectric conversion and electric charge storage are performed in the silicon substrate is not applicable to the above-described laminated solid-state image pickup unit. Therefore, a contact section configured to electrically connect the inside and the outside of the silicon substrate to each other is provided; however, this contact section causes occurrence of a dark current.

To suppress such occurrence of the dark current, there has been proposed a technique of storing an electric charge generated by photoelectric conversion in not an electric charge storage layer (an impurity diffusion layer) in a silicon substrate but a gate electrode of amplification transistor (for example, refer to PTLs 1 and 2).

CITATION LIST

Patent Literature

PTL 1: Japanese Unexamined Patent Application Publication No. 2010-80953
PTL 2: Japanese Unexamined Patent Application Publication No. 2011-87544

SUMMARY OF INVENTION

It is desired to achieve, by a technique different from PTLs 1 and 2, a unit configuration having high reliability while suppressing a dark current with use of the gate electrode of the amplification transistor.

Therefore, it is desirable to provide a solid-state image pickup unit and an electronic apparatus each of which makes it possible to suppress occurrence of a dark current generation, thereby achieving high reliability.

A first solid-state image pickup unit according to an embodiment of the present disclosure includes: a substrate made of a first semiconductor; a photoelectric conversion device provided on the substrate and including a first electrode, a photoelectric conversion layer, and a second electrode in order from the substrate; and a plurality of field-effect transistors configured to perform signal reading from the photoelectric conversion device. The plurality of transistors include a transfer transistor and an amplification transistor, the transfer transistor includes an active layer containing a second semiconductor with a larger band gap than that of the first semiconductor, and one terminal of a source and a drain of the transfer transistor also serves the first electrode or the second electrode of the photoelectric conversion device, and the other terminal of the transfer transistor is connected to a gate of the amplification transistor.

In the first solid-state image pickup unit according to the embodiment of the present disclosure, in a configuration in which the photoelectric conversion device is provided on the substrate made of the first semiconductor, one terminal of the source and the drain of the transfer transistor also serves as the first electrode or the second electrode of the photoelectric conversion device, and the other terminal is connected to the gate of the amplification transistor. Therefore, a pn junction is not formed in a transmission path of an electric charge extracted from the photoelectric conversion device, and generation of a dark current caused by a depletion layer is suppressed. Moreover, when the active layer of the transfer transistor contains the second semiconductor with a larger band gap than that of the first semiconductor, generation of a dark current caused by a minority electric charge generated in the transfer transistor or a dark current caused by a diffusion current is suppressed.

A second solid-state image pickup unit according to an embodiment of the present disclosure includes: a substrate made of a first semiconductor; a photoelectric conversion device provided on the substrate and including a first electrode, a photoelectric conversion layer, and a second electrode in order from the substrate; and a plurality of field-effect transistors configured to perform signal reading from the photoelectric conversion device. The plurality of transistors include a reset transistor and an amplification transistor, the reset transistor includes an active layer containing a second semiconductor with a larger band gap than that of the first semiconductor, and the first electrode or the second electrode of the photoelectric conversion device is connected to one terminal of a source and a drain of the reset transistor, and is connected to a gate of the amplification transistor.

In the second solid-state image pickup unit according to the embodiment of the present disclosure, in a configuration in which the photoelectric conversion device is provided on the substrate made of the first semiconductor, the first electrode or the second electrode of the photoelectric conversion device is connected to one terminal of the source and the drain of the reset transistor, and is connected to the gate of the amplification transistor. Therefore, a pn junction is not formed in a transmission path of an electric charge extracted from the photoelectric conversion device, and generation of a dark current caused by a depletion layer is suppressed. Moreover, when the active layer of the reset transistor contains the second semiconductor with a larger band gap than that of the first semiconductor, generation of a dark current caused by a minority electric charge generated in the reset transistor or a dark current caused by a diffusion current is suppressed.

A first electronic apparatus according to an embodiment of the present disclosure includes the first solid-state image pickup unit according to the embodiment of the present disclosure.

A second electronic apparatus according to an embodiment of the present disclosure includes the second solid-state image pickup unit according to the embodiment of the present disclosure.

In the first solid-state image pickup unit and the first electronic apparatus according to the embodiments of the present disclosure, in the configuration in which the photoelectric conversion device is provided on the substrate made of the first semiconductor, the active layer of the transfer transistor contains the second semiconductor with a larger band gap than that of the first semiconductor, and one terminal of the source and the drain of the transfer transistor also serves as the first electrode or the second electrode of the photoelectric conversion device, and the other terminal of the transfer transistor is connected to the gate of the amplification transistor. Therefore, generation of a dark current is allowed to be suppressed, and a unit configuration with high reliability is achievable accordingly.

In the second solid-state image pickup unit and the second electronic apparatus according to the embodiments of the present disclosure, in the configuration in which the photoelectric conversion device is provided on the substrate made of the first semiconductor, the active layer of the reset transistor contains the second semiconductor with a larger band gap than that of the first semiconductor, and the first electrode or the second electrode of the photoelectric conversion device is connected to one terminal of the source and the drain of the reset transistor, and is connected to the gate of the amplification transistor. Therefore, generation of a dark current is allowed to be suppressed, and a unit configuration with high reliability is achievable accordingly.

BRIEF DESCRIPTION OF DRAWINGS

FIG. 1 is a schematic sectional view illustrating a schematic configuration of a solid-state image pickup unit according to a first embodiment of the present disclosure.

FIG. 2 is an equivalent circuit diagram illustrating a connection relationship between a photoelectric conversion device and a transistor illustrated in FIG. 1.

FIG. 3 is a schematic plan view illustrating an example of a layout of a wide gap semiconductor layer and a gate electrode illustrated in FIG. 1.

FIG. 4A is a schematic view for describing an action by a gate length of the gate electrode illustrated in FIG. 3.

FIG. 4B is a schematic view for describing the action by the gate length of the gate electrode illustrated in FIG. 3.

FIG. 5 is a schematic sectional view illustrating a schematic configuration of a solid-state image pickup unit according to a comparative example.

FIG. 6 is a schematic view for describing an effect of suppressing a dark current by a wide gap semiconductor.

FIG. 7 is a schematic sectional view illustrating a schematic configuration of a solid-state image pickup unit according to Modification Example 1.

FIG. 8 is a schematic sectional view illustrating a schematic configuration of a solid-state image pickup unit according to Modification Example 2.

FIG. 9 is a schematic sectional view illustrating a schematic configuration of a solid-state image pickup unit according to Modification Example 3.

FIG. 10 is a schematic sectional view illustrating a schematic configuration of a solid-state image pickup unit according to a second embodiment of the present disclosure.

FIG. 11 is an equivalent circuit diagram illustrating a connection relationship between a photoelectric conversion device and a transistor illustrated in FIG. 10.

FIG. 12 is a schematic plan view illustrating an example of a layout of the transistor and a photodiode illustrated in FIG. 10.

FIG. 13 is a schematic plan view illustrating a layout of a reset transistor illustrated in FIG. 10.

FIG. 14 is a schematic sectional view illustrating a schematic configuration of a solid-state image pickup unit according to Modification Example 4.

FIG. 15 is a schematic sectional view illustrating a schematic configuration of a solid-state image pickup unit according to Modification Example 5.

FIG. 16 is a schematic sectional view illustrating a schematic configuration of a solid-state image pickup unit according to Modification Example 6.

FIG. 17 is a schematic sectional view illustrating a schematic configuration of a solid-state image pickup unit according to Modification Example 7.

FIG. 18 is a functional block diagram illustrating an entire configuration of any of the solid-state image pickup units illustrated in FIGS. 1 and 10.

FIG. 19 is a block diagram illustrating a schematic configuration of an electronic apparatus using any of the solid-state image pickup units illustrated in FIGS. 1 and 10.

DESCRIPTION OF EMBODIMENTS

Some embodiments of the present disclosure will be described in detail below referring to the accompanying drawings. It is to be noted that description will be given in the following order.

1. First Embodiment (An example of a solid-state image pickup unit (4Tr) in which a source of a transfer transistor also serves as a lower electrode of a photoelectric conversion device and a drain of the transfer transistor is connected to a gate of an amplification transistor)

2. Modification Example 1 (An example in a case where a light-shielding layer is used)
3. Modification Example 2 (An example in a case where a UV-cut filter is used)
4. Modification Example 3 (An example in a case where active layers and sources/drains of all of 4Tr are formed of a wide gap semiconductor)
5. Second Embodiment (An example of a solid-state image pickup unit (3Tr) in which a gate of an amplification transistor and a source of a rest transistor made of a wide gap semiconductor are connected to a lower electrode of a photoelectric conversion device)
6. Modification Example 4 (An example in a case where a light-shielding layer is used) 7. Modification Example 5 (Another example in the case where the light-shielding layer is used)
8. Modification Example 6 (An example in a case where a UV-cut filter is used)
9. Modification Example 7 (An example in a case where active layers and sources/drains of all of 3Tr are formed of a wide gap semiconductor)
9. Application Example 1 (An entire configuration example of a solid-state image pickup unit)
10. Application Example 2 (An example of an electronic apparatus (camera))

First Embodiment

[Configuration]

FIG. 1 schematically illustrates a sectional configuration of a solid-state image pickup unit (a solid-state image pickup unit 1) according to a first embodiment of the present disclosure. The solid-state image pickup unit 1 may be, for example, a CCD, a CMOS image sensor, or the like. It is to be noted that FIG. 1 illustrates a region corresponding to one pixel of a pixel section (a pixel section 1a illustrated in FIG. 18) that will be described later. Moreover, a front-side illumination configuration will be described below as an example; however, a back-side illumination configuration may be adopted.

In the solid-state image pickup unit 1, for example, a photoelectric conversion device 10 may be formed on a surface S1 (a circuit formation surface) of a semiconductor substrate 11 made of silicon (Si) with a multilayer wiring layer 12 in between. For example, a plurality of pixel transistors may be provided on the surface S1 of the semiconductor substrate 11 as drive devices configured to perform signal reading from the photoelectric conversion device 10. More specifically, four transistors in total, i.e., a transfer transistor Tr1(TRF), a reset transistor Tr2(RST), an amplification transistor Tr3(AMP), and a selection transistor Tr4(SEL) (that hereinafter may be simply referred to as "transistors Tr1 to Tr4", respectively) are formed. The solid-state image pickup unit 1 has a so-called 4Tr configuration in which signal reading from the photoelectric conversion device 10 is performed with use of these four transistors Tr1 to Tr4. On the surface S1 of this semiconductor substrate 11, such transistors Tr1 to Tr4 are provided, and a peripheral circuit configured of a logic circuit and the like is formed. Specific configurations of the transistors Tr1 to Tr4 will be described later.

(Photoelectric Conversion Device 10)

The photoelectric conversion device 10 may be, for example, an organic photoelectric conversion device configured to generate an electron-hole pair by absorbing light of a selective wavelength (for example, green light) or light of an entire wavelength with use of an organic semiconductor. The photoelectric conversion device 10 has a configuration in which an organic photoelectric conversion layer 15 is sandwiched between a lower electrode 13A (a first electrode) and an upper electrode 16 (a second electrode) as a pair of electrodes configured to extract an electric charge. An inter-pixel insulating film 14 having an opening H is formed on the lower electrode 13A, and photoelectric conversion regions of respective pixels are isolated from one another by the inter-pixel insulating film 14. On the upper electrode 16, a protective film is formed, and if necessary, a planarization film, an on-chip lens, and the like may be formed. Respective components will be described in detail below.

The lower electrode 13A may be provided for each pixel, and an electric charge (for example, an electron) extracted from this lower electrode 13A is read as a signal charge. In this embodiment, as will be described in detail later, this lower electrode 13A serves as a storage layer for an electric charge generated in the organic photoelectric conversion layer 15, and corresponds to a terminal section (for example, a source) of the transfer transistor Tr1, and is configured to contain a wide gap semiconductor.

The inter-pixel insulating film 14 may be configured of, for example, a single-layer film made of one kind of silicon oxide, silicon nitride, and silicon oxynitride (SiON), or a laminate film made of two or more kinds of them. This inter-pixel insulating film 14 has a function of electrically isolating the lower electrodes 13A of respective pixels from one another.

The organic photoelectric conversion layer 15 is configured to perform photoelectric conversion on light of a selective wavelength or an entire wavelength, and may desirably contain one or both of P-type and N-type organic semiconductors. As such organic semiconductors, one kind of a quinacridone derivative, a naphthalene derivative, an anthracene derivative, a phenanthrene derivative, a tetracene derivative, a pyrene derivative, a perylene derivative, and a fluoranthene derivative may be preferably used. Alternatively, a polymer such as phenylenevinylene, fluorene, carbazole, indole, pyrene, pyrrole, picoline, thiophene, acetylene, or diacetylene, or a derivative thereof may be used. In addition, a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthoquinone, an anthraquinone-based dye, a fused polycyclic aromatic group such as anthracene or pyrene, a chain compound prepared by fusing an aromatic ring or a heterocyclic compound, quinoline having a squarylium group and a croconic methine group as a joining chain, two or more nitrogen-containing heterocyclic rings such as benzothiazole or benzoxazol, a cyanine-like dye bonded by a squarylium group and a croconic methine group, or the like may be preferably used. It is to be noted that, as the above-described metal complex dye, a dithiol metal complex-based dye, a metal phthalocyanine dye, a metal porphyrin dye, or a ruthenium complex dye may be preferable; however, the metal complex dye is not limited thereto.

This organic photoelectric conversion layer 15 may be formed at least in a region facing the opening H serving as a photoelectric conversion region; however, the organic photoelectric conversion layer 15 may be desirably formed also in a region other than the opening H to cover a region facing a wide gap semiconductor layer 13 that will be described later. In this case, the wide gap semiconductor layer 13 may be made of, for example, an oxide semiconductor as will be described later; however, in this case, transistor characteristics are easily varied with respect to a wavelength that the oxide semiconductor absorbs specifically in a short wavelength region (for example, 400 nm or less). Therefore, when the organic photoelectric conversion layer 15 is formed above the semiconductor layer 13, such a short wavelength is allowed to be blocked by the organic photoelectric conversion layer 15, thereby suppressing deterioration in the transistor characteristics. It is to be noted that, any other unillustrated layer may be provided between the organic photoelectric conversion layer 15 and the lower electrode 13A and between the organic photoelectric conversion layer 15 and the upper electrode 16. For example, a under coat film, an electron blocking film, the organic photoelectric conversion layer 15, a hole blocking film, a buffer film, a work function adjustment film, and the like may be laminated in order from the lower electrode 13A.

The upper electrode 16 is configured of a conductive film having light transmittance. Examples of such a conductive film may include ITO (indium tin oxide). However, as the material of the lower electrode 13A, in addition to this ITO, a tin oxide ($SnO_2$)-based material doped with a dopant, or a zinc oxide (ZnO)-based material doped with a dopant may be used. Examples of the zinc oxide-based material may include aluminum zinc oxide (AZO) containing aluminum (Al) as a dopant, gallium zinc oxide (GZO) containing gallium (Ga) as a dopant, and indium zinc oxide (IZO) containing indium (In) as a dopant. Moreover, in addition to them, CuI, $InSbO_4$, ZnMgO, $CuInO_2$, $MgIn_2O_4$, CdO, $ZnSnO_3$, and the like may be used. It is to be noted that, when a signal charge (an electron) are read from the lower electrode 13A, an electric charge (for example, a hole) extracted from the upper electrode 16 are discharged; therefore, the upper electrodes 16 of respective pixels may be isolated from one another, or the upper electrode 16 may be formed as a common electrode for respective pixels.

(Transistors Tr1 to Tr4)

Each of the transfer transistor Tr1, the reset transistor Tr2, the amplification transistor Tr3, and the selection transistor Tr4 may be, for example, a field-effect thin film transistor (TFT) having three terminals, i.e., a gate, a source, and a drain.

In this embodiment, the reset transistor Tr2, the amplification transistor Tr3, and the selection transistor Tr4 of these transistors Tr1 to Tr4 are formed on the surface S1 of the semiconductor substrate 11 (more specifically, in proximity to an interface between the semiconductor substrate 11 and the multilayer wiring layer 12). For example, active layers and source/drain layers (layers functioning as a source or a drain) 114 of the transistors Tr2 to Tr4 are formed in a p-type semiconductor well region of a surface layer of the surface S1 of the semiconductor substrate 11. Gate electrodes 111, 112, and 113 of the transistors Tr2 to Tr4 are formed on the surface S1 of the semiconductor substrate 11 with an insulating film in between. The source/drain layers 114 are so formed as to be buried as n-type impurity diffusion layers in the semiconductor substrate 11. Moreover, in this case, the source/drain layer 114 is shared between the reset transistor Tr2 and the amplification transistor Tr3, and the source/drain layer 114 is shared between the amplification transistor Tr3 and the selection transistor Tr4. It is to be noted that except for the transfer transistor Tr1, the transistors Tr2 to Tr4 may be shared between pixels (for example, adjacent pixels).

FIG. 2 illustrates an example of a pixel circuit including the photoelectric conversion device 10 and the transistors Tr1 to Tr4. Thus, the pixel circuit of this embodiment includes one photoelectric conversion device and four transistors Tr1 to Tr4, and a cathode of the photoelectric conversion device 10 is connected to one terminal (for example, the source) of the source and the drain of the transfer transistor Tr1. The other terminal (for example, the drain) of the transfer transistor Tr1 is connected to a gate (a gate electrode 112) of the amplification transistor Tr3 and a terminal (for example, the source) of the reset transistor Tr2. The drain of the amplification transistor Tr3 may be connected to, for example, the drain of the reset transistor Tr2, and the source of the amplification transistor Tr3 may be connected to, for example, the source of the selection transistor Tr4. The drain of the selection transistor Tr4 may be connected to, for example, a vertical signal line Lsig that will be described later. The gate (a gate electrode 113) of this selection transistor Tr4 is connected to a pixel drive line Lread that will be described later.

As described above, while the transistors Tr2 to Tr4 including the amplification transistor Tr3 of the transistors Tr1 to Tr4 are formed on the surface S1 of the semiconductor substrate 11, the transfer transistor Tr1 is provided on the multilayer wiring layer 1 above the semiconductor substrate 11.

The transfer transistor Tr1 includes an active layer (an active layer 13C) containing a semiconductor with a larger band gap (hereinafter referred to as "wide gap semiconductor") than that of the material (for example, silicon) of the semiconductor substrate 11. A region serving as the source of the transfer transistor Tr1 also serves as the lower electrode 13A. More specifically, the transfer transistor Tr1 includes a wide gap semiconductor layer 13 provided on the multilayer wiring layer 12 and a gate electrode 120 that is disposed to face a part of the wide gap semiconductor layer 13. A part facing the gate electrode 120 of the wide gap semiconductor layer 13 functions as the active layer 13C, and includes a region that is adjacent to the active layer 13C and functions as the source and the lower electrode 13A and a portion (a FD 13B) functioning as a drain. The FD 13B functioning as the drain forms a so-called floating diffusion. As described above, this FD 13B may be connected to the gate electrode 112 of the amplification transistor Tr3 through, for example, a wiring layer 121 formed in the multilayer wiring layer 12. Moreover, this FD 13B is also connected to the source/drain layer 114 of the reset transistor Tr2.

The wide gap semiconductor layer 13 may be made of a wide gap semiconductor, for example, an oxide semiconductor including one or more kinds of indium (In), zinc (Zn), gallium (Ga), and the like.

FIG. 3 illustrates an example of a planar (a plane along the surface S1 of the semiconductor substrate 11) layout of the wide gap semiconductor layer 13 and the gate electrode 120. In the wide gap semiconductor layer 13, the lower electrode 13A may have, for example, a square or a rectangular shape covering a light reception region (a region facing the opening H) of the photoelectric conversion device 10 in such a manner. The wide gap semiconductor layer 13 may have a protruded portion (a protrusion section 13BC) along a predetermined direction from a corner of such a shape of the lower electrode 13A, and the gate electrode 120 is so disposed as to straddle a part of the protrusion section 13BC. A portion exposed from the gate electrode 120 of the protrusion section 13BC serves as the FD 13B.

In the transfer transistor Tr1, a gate length a of the gate electrode 120 may be desirably set to a predetermined length or longer. In this case, as illustrated in FIG. 4A, when the gate length a of the transfer transistor Tr1 is long (a=a1), a leakage current (a dark current) from the lower electrode 13A to the FD 13B is less likely to be generated in an off state; however, as illustrated in FIG. 4B, when the gate length a is too short (a=a2), a dark current is more likely to be increased by a short channel effect. Therefore, the gate length a of the transfer transistor Tr1 may be desirably set to a length at which a dark current caused by such a short channel effect is allowed to be suppressed, or longer.

[Action and Effects]

In the above-described solid-state image pickup unit 1, when light enters the photoelectric conversion device 10 from the upper electrode 16, a part or a whole of the entered light is detected (absorbed) by the organic photoelectric conversion layer 15. Therefore, in the organic photoelectric conversion layer 15, an electron-hole pair is generated, and one (for example, an electron) of the electron-hole pair is read as a signal charge. It is to be noted that a case where the signal charge and the electron are read from the lower electrode 13A will be described as an example below.

More specifically, first, in an electric charge storage state (a state in which the reset transistor Tr2 and the transfer transistor Tr1 are off), the lower electrode 13A is reset to a predetermined voltage, and a relatively low voltage with respect to the reset voltage is applied to the upper electrode 16. Thus, the electron of the electron-hole pair generated in the organic photoelectric conversion layer 15 is guided to the lower electrode 13A that has a relatively high potential (a hole is guided to the upper electrode 16).

In this case, in this embodiment, the transfer transistor Tr1 includes the active layer 13C containing the wide gap semiconductor and the source of the transfer transistor Tr1 serves as the lower electrode 13A. Therefore, in a state in which the transfer transistor Tr1 is off, the electron generated in the organic photoelectric conversion layer 15 is guided to the lower electrode 13A to be stored in the lower electrode 13A (The source of the transfer transistor Tr1 functions as an electric charge storage layer).

The electron stored in the lower electrode 13A is transferred to the FD 13B during a reading operation. More specifically, a predetermined ON potential is applied to the gate electrode 120 of the transfer transistor Tr1, and the transfer transistor Tr1 is turned on, the electric charge (electron) stored in the lower electrode 13A is transferred to the FD 13B. The electric charge transferred to the FD 13B is read as a voltage signal to the vertical signal line Lsig that will be described later through the amplification transistor Tr3, the selection transistor Tr4, and the like.

After this reading operation, when both the reset transistor Tr2 and the transfer transistor Tr1 are turned on, the FD 13B and the gate electrode 112 of the amplification transistor Tr3 may be reset to a power supply voltage VDD accordingly. Therefore, the lower electrode 13A is depleted, and after that, when the transfer transistor Tr1 is turned off, the state is transitioned to the above-described electric charge storage state.

Comparative Example

FIG. 5 illustrates a sectional configuration of a solid-state image pickup unit according to a comparative example. In this comparative example, as with the solid-state image pickup unit of this embodiment, a photoelectric conversion device 1010 is formed on the surface S1 of a semiconductor substrate 1011 with a multilayer wiring layer 1012. The photoelectric conversion device 1010 is configured by laminating an organic photoelectric conversion layer 1014 and an upper electrode 1015 on a lower electrode 1013. Moreover, a plurality of transistors (in this case, for simplification, only a reset transistor Tr101 and an amplification transistor Tr102 are illustrated) configured to perform signal reading from the photoelectric conversion device 1010 are formed on the surface S1 of the semiconductor substrate 1011. In a configuration of such a laminated solid-state image pickup unit, in the comparative example, the lower electrode 1013 is stored in an n-type impurity diffusion layer 1019 formed in a surface layer of the semiconductor substrate 1011.

In this comparative example, an electron generated in the organic photoelectric conversion layer 1014 is stored in the n-type impurity diffusion layer 1019 formed in the semiconductor substrate 1011 through the lower electrode 1013 and a wiring line 1020. At this time, the n-type impurity diffusion layer 1019 is formed in a p-type well region of the semiconductor substrate 1011; therefore, a pn junction occurs, and a depletion layer is formed at an interface of this junction. When an interface, with a large number of defects, between silicon and silicon oxide comes into contact with such a depletion layer, a dark current is generated, thereby causing deterioration in device characteristics.

On the other hand, in this embodiment, as described above, the source of the transfer transistor Tr1 also serves the lower electrode 13A of the photoelectric conversion device 10, and the drain (the FD 13B) of the transfer transistor Tr1 is connected to the gate electrode 112 of the amplification transistor Tr3. Therefore, a pn junction is not formed in an electric charge transmission path from the photoelectric conversion device 10 to the semiconductor substrate 11 (at least a path from the lower electrode 13A to the FD 13B), and generation of a dark current caused by the depletion layer in the comparative example is suppressed.

Moreover, the source of the transfer transistor Tr1 functions as the lower electrode 13A of the photoelectric conversion device 10, and also functions as an electric charge storage layer. Since this transfer transistor Tr1 includes the active layer 13A containing the wide gap semiconductor (for example, an oxide semiconductor), a hole-electron pair X1 is less likely to be generated in the transfer transistor Tr1, and since a minority carrier concentration is small, generation of a dark current caused by the hole-electron pair X1 and a dark current caused by a diffusion current X2 from below the gate electrode 120 is suppressed (refer to FIG. 6).

As described above, in this embodiment, in a configuration in which the photoelectric conversion device 10 is provided on the semiconductor substrate 11, the source of the transfer transistor Tr1 also serves as the lower electrode 13A of the photoelectric conversion device 10, and the drain of the transfer transistor Tr1 is connected to the gate electrode 112 of the amplification transistor Tr3. Therefore, a pn junction is not formed in the electric charge transmission path from the photoelectric conversion device 10 to the semiconductor substrate 11, and generation of a dark current caused by the depletion layer at the pn junction interface is allowed to be suppressed accordingly. Moreover, generation of a dark current caused by a minority electric charge generated in the transfer transistor Tr1 or a diffusion current is allowed to be suppressed by containing the wide gap semiconductor in the active layer 13C of the transfer transistor Tr1. Therefore, the generation of the dark current is allowed to be suppressed, thereby achieving a unit configuration with high reliability.

Next, modification examples (Modification Examples 1 to 3) of the solid-state image pickup unit 1 of the above-described first embodiment will be described below. In the following description, like components are denoted by like numerals as of the above-described embodiment and will not be further described.

Modification Example 1

FIG. 7 schematically illustrates a sectional configuration of a solid-state image pickup unit according to Modification Example 1. In the above-described first embodiment, the organic photoelectric conversion layer 15 is so formed as to cover the region facing the wide gap semiconductor layer 13 to protect the wide gap semiconductor layer 13 from light in a short wavelength region; however, like this modification example, a light-shielding layer 17 may be provided. The light-shielding layer 17 may be made of a material different from the organic semiconductor forming the organic photoelectric conversion layer 15, for example, tungsten or the like. Even in such a configuration, variation in transistor characteristics caused by light application to the wide gap semiconductor layer 13 is allowed to be suppressed.

Modification Example 2

FIG. 8 schematically illustrates a sectional configuration of a solid-state image pickup unit according to Modification Example 2. In the above-described first embodiment, the organic photoelectric conversion layer 15 is so formed as to cover the region facing the wide gap semiconductor layer 13 to protect the wide gap semiconductor layer 13 from light in the short wavelength region; however, like in this modification example, for example, a UV-cut filter 18 configured to block 80% or over of ultraviolet radiation (UV) may be provided on a light incident side of the photoelectric conversion device 10. Even in such a configuration, variation in transistor characteristics by light application to the wide gap semiconductor layer 13 is allowed to be suppressed.

Modification Example 3

FIG. 9 schematically illustrates a sectional configuration of a solid-state image pickup unit according to Modification Example 3. In the above-described first embodiment, only the transfer transistor Tr1 of the four transistors Tr1 to Tr4 is formed of the wide gap semiconductor on the multilayer wiring layer; however, all of these four transistors Tr1 to Tr4 may be formed of the wide gap semiconductor.

Specifically, a wide gap semiconductor layer 19 is provided on the multilayer wiring layer 12, and this wide gap semiconductor layer 19 is configured to include the active layers and the sources/drains of the transfer transistor Tr1, the reset transistor Tr2, the amplification transistor Tr3, and the selection transistor Tr4.

More specifically, as with the above-described embodiment, the transfer transistor Tr1 includes the wide gap semiconductor layer 19 and the gate electrode 120 disposed to face a part of the wide gap semiconductor layer 19. The part facing the gate electrode 120 of the wide gap semiconductor layer 19 includes a region functioning as the active layer C1, and disposed adjacent to the active layer C1 to function as a source and a lower electrode 19A of the photoelectric conversion device 10, and a portion (FD 19B) functioning as a drain. The wide gap semiconductor layer 19 is made of a similar material to that of the wide gap semiconductor layer 13 of the above-described first embodiment, and the function, shape, and the like of the lower electrode 19A are similar to those of the above-described lower electrode 13A.

In this modification example, respective gate electrodes 111, 112, and 113 of the reset transistor Tr2, the amplification transistor Tr3, and the selection transistor Tr4 are provided to face a part of the wide gap semiconductor layer 19. The wide gap semiconductor layer 19 includes an active layer C2 of the reset transistor Tr2, an active layer C3 of the amplification transistor Tr3, and an active layer C4 of the selection transistor Tr4 in order from the FD 19B of the transfer transistor Tr1. The active layers C2, C3, and C4 are so formed as to face the gate electrodes 111, 112, and 113, respectively.

In such a wide gap semiconductor layer 19, the drain (FD 19B) of the transfer transistor Tr1 functions as a floating diffusion, and may also serve as, for example, the source of the reset transistor Tr2. A region between the active layers C2 and C3 may serve as, for example, a source dl shared between the reset transistor Tr1 and the amplification transistor Tr3. A region between the active layers C3 and C4 may serve as, for example, the source dl shared between the amplification transistor Tr4 and the selection transistor Tr4. A drain d3 of the selection transistor Tr4 is connected to the vertical signal line Lsig that will be described later through a wiring line 122. Moreover, the drain of the transfer transistor Tr1 (the source of the reset transistor Tr2) is connected to the gate electrode 112 of the amplification transistor Tr3 through a wiring line 121.

Like this modification example, a configuration in which all of the four transistors Tr1 to Tr4 are formed with use of the wide gap semiconductor may be adopted, and even in this case, similar effects to those in the above-described first embodiment are allowed to be obtained. Moreover, in such a configuration, all operations of resetting, storage, transfer of the electric charge, signal amplification in a source follower are allowed to be performed with use of the wide gap semiconductor layer 19.

It is to be noted that, in this modification example, a configuration in which all of the four transistors Tr1 to Tr4 are formed with use of the wide gap semiconductor is exemplified; however, the modification example is not limited thereto, and two or three transistors (including at least the transfer transistor Tr1 and the reset transistor Tr2) of the four transistors Tr1 to Tr4 may be formed with use of the wide gap semiconductor. For example, a configuration in which the transfer transistor Tr1 and the reset transistor Tr2 are formed of the wide gap semiconductor, and the other two transistors are formed on the surface S1 of the semiconductor substrate 11 may be adopted. Alternatively, a configuration in which the transfer transistor Tr1, the reset transistor Tr2, and the amplification transistor Tr3 are formed of the wide gap semiconductor and the selection transistor Tr4 is formed on the surface S1 of the semiconductor substrate 11 may be adopted.

Further, in the above-described first embodiment and Modification Examples 1 to 3, a configuration of a front-side illumination solid-state image pickup unit is described as an example; however, the above-described 4Tr configuration (a configuration in which the transfer transistor Tr1 containing the wide gap semiconductor serves as both the lower electrode 13A (19A) of the photoelectric conversion device 10 and the floating diffusion) is applicable to a back-side illumination solid-state image pickup unit. Moreover, the solid-state image pickup unit may be any laminated solid-state image pickup unit (laminate solid-state image pickup unit including a photoelectric conversion layer on a semiconductor) such as a longitudinal spectral solid-state image pickup unit that will be described later and a solid-state image pickup unit in which photoelectric conversion devices of a plurality of colors are two-dimensionally arranged (for example, in a Bayer arrangement) on the semiconductor substrate 11.

Second Embodiment

[Configuration]

FIG. 10 schematically illustrates a sectional configuration of a solid-state image pickup unit (a solid-state image pickup unit 2) according to a second embodiment of the present disclosure. As with the solid-state image pickup unit according to the above-described first embodiment, the solid-state image pickup unit 2 may be, for example, a CCD, a CMOS image sensor, or the like. It is to be noted that FIG. 10 illustrates a region corresponding to one pixel of a pixel section (the pixel section 1a illustrated in FIG. 18) that will be described later. Moreover, a back-side illumination configuration will be described below as an example; however, a front-side illumination configuration may be adopted. In the following description, like components are denoted by like numerals as of the above-described first embodiment and will not be further described.

In the solid-state image pickup unit 2, a photoelectric conversion device 10a may be formed on the surface S1 (a surface on a light reception side) of the semiconductor substrate 11 with, for example, an interlayer insulating film 123 in between, and the multilayer wiring layer 12 may be formed on a surface S2 (a circuit formation surface) of the semiconductor substrate 11. In this embodiment, for example, a plurality of pixel transistors may be provided on the surface S2 of the semiconductor substrate 11 as drive devices configured to perform signal reading from the photoelectric conversion device 10a. More specifically, three transistors in total, i.e., a reset transistor Tr5(RST), an amplification transistor Tr6(AMP), and a selection transistor Tr7(SEL) (that hereinafter may be simply referred to as "transistors Tr5 to Tr7", respectively) are formed. The solid-state image pickup unit 2 has a so-called 3Tr configuration in which signal reading from the photoelectric conversion device 10a is performed with use of these three transistors Tr5 to Tr7. On the surface S2 of the semiconductor substrate 11, these transistors Tr5 to Tr7 are provided, and a peripheral circuit configured of a logic circuit and the like is formed. Specific configurations of the transistors Tr5 to Tr7 will be described later.

This solid-state image pickup unit 2 has a configuration in which photoelectric conversion devices configured to selectively detect light in different wavelength regions from one another to perform photoelectric conversion are laminated in a longitudinal direction. More specifically, in the solid-state image pickup unit 2, for example, the photoelectric conversion device 10a using an organic semiconductor may be provided on the semiconductor substrate 11, and, for example, two photodiodes 11B and 11R may be so formed as to be buried in the semiconductor substrate 11. With such a configuration, spectral acquisition of respective color signals of red (R), green (G), and blue (B) is performed in a longitudinal direction, and a plurality of kinds of color signals are obtained in one pixel without using a color filter.

(Photoelectric Conversion Device 10a)

The photoelectric conversion device 10a may be, for example, an organic photoelectric conversion device configured to generate an electron-hole pair by absorbing light of a selective wavelength (for example, green light) with use of an organic semiconductor. Moreover, the photoelectric conversion device 10a has a configuration in which the organic photoelectric conversion layer 15 is sandwiched between a lower electrode 20 (a first electrode) and the upper electrode 16 (a second electrode) as a pair of electrodes configured to extract an electric charge generated by photoelectric conversion. Moreover, as with the above-described first embodiment, photoelectric conversion regions of respective pixels are isolated from one another by the inter-pixel insulating film 14. In this case, surfaces of the lower electrode 20 and the inter-pixel insulating film 14 are planarized. Moreover, a protective film is formed on the upper electrode 16, and if necessary, a planarization film, an on-chip lens, and the like may be formed. It is to be noted that green (G) may be, for example, a color corresponding to a wavelength region from 495 nm to 570 nm both inclusive, and it is only necessary that the organic photoelectric conversion layer 15 is allowed to detect light in a part or a whole of this wavelength region.

The organic photoelectric conversion layer 15 may be formed at least in a region facing the lower electrode 20 serving as a photoelectric conversion region. In this embodiment, the semiconductor substrate 11 is interposed above the wide gap semiconductor layer 21 that will be described later; therefore, light in a short wavelength region is absorbed by this semiconductor substrate 11, and thus, the light in the short wavelength region is inhibited from reaching the wide gap semiconductor layer 21.

For example, the lower electrode 20 may be provided for each pixel, and an electric charge (for example, an electron) may be extracted from the lower electrode 20. In this embodiment, this lower electrode 20 is configured of a conductive film having light transmittance. As such a conductive film, a similar material to that of the upper electrode 16 described in the above-described first embodiment may be used.

Each of the photodiodes 11B and 11R is a photodiode having a pn junction, and the photodiodes 11B and 11R are formed in this order in an optical path in the semiconductor substrate 11. The photodiode 11B of them may be configured to selectively detect, for example, blue light and allow an electric charge corresponding to blue to be stored therein, and may be so formed as to extend, for example, from a selective region along the surface S1 of the semiconductor substrate 11 to a region in proximity to an interface with the multilayer wiring layer 12. The photodiode 11R may be configured to selectively detect, for example, red light and allow a electric charge corresponding to red to be stored therein, and may be formed in, for example, a region below the photodiode 11B (on the surface S2 side). It is to be noted that blue (B) may be, for example, a color corresponding to a wavelength region from 450 nm to 495 nm, red (R) may be, for example, a color corresponding to a wavelength region from 620 nm to 750 nm, and each of the photodiodes 11B and 11R may detect light in a part or a whole of each of the wavelength regions.

These photodiodes 11B and 11R each are connected to the transfer transistor through an unillustrated floating diffusion. It is to be noted that FIG. 10 illustrates only gates (gate electrodes 115 and 116) of transfer transistors of the photodiodes 11B and 11R.

In the semiconductor substrate 11, the above-described photodiodes 11B and 11R are formed, and a conductive plug 121B configured to electrically connect the lower electrode 20 and the transistors (such as the reset transistor Tr5 and the like) formed on the surface S2 of the semiconductor substrate 11 to each other is so formed as to be buried. The conductive plug 121B may be made of, for example, a conductive film material such as tungsten embedded in a through via. A side surface of the through via may be desirably covered with, for example, an insulating film such as silicon oxide ($SiO_2$) or silicon nitride (SiN) to suppress a short circuit to silicon. This conductive plug 121B is connected to a wiring line 121A formed in the interlayer insulating film 123 and a wiring line 121C in the multilayer wiring layer 12. The wiring line 121A is connected to the lower electrode 20.

(Transistors Tr5 to Tr7)

Each of the reset transistor Tr5, the amplification transistor Tr6, and the selection transistor Tr7 may be, for example, a field-effect thin film transistor (TFT) having three terminals, i.e., a gate, a source, and a drain, as with the transistors Tr1 to Tr4 of the above-described first embodiment.

FIG. 11 illustrates an example of a pixel circuit including the photoelectric conversion device 10a and the transistors Tr5 to Tr7. The pixel circuit of this embodiment includes one photoelectric conversion device 10a and three transistors Tr5 to Tr7 in such a manner. A cathode (the lower electrode 20) of the photoelectric conversion device 10a may be connected to the gate (a gate electrode 112) of the amplification transistor Tr6, and may be connected to the source (a source 21A) of the reset transistor Tr5 through the wiring line 121A, the conductive plug 121B, and the wiring line 121C. In other words, for example, the source 21A of the reset transistor Tr5 may be connected to the gate electrode 112 of the amplification transistor Tr6. The source of the amplification transistor Tr6 may be connected to, for example, the drain of the selection transistor Tr7. The source of the selection transistor Tr7 is connected to the vertical signal line Lsig that will be described later, and the gate (a gate electrode 113) of the selection transistor Tr7 is connected to the pixel drive line Lread that will be described later.

In this embodiment, the amplification transistor Tr6 and the selection transistor Tr7 of these transistors Tr5 to Tr7 are formed in proximity to an interface between the surface S2 of the semiconductor substrate 11 and the multilayer wining layer 12. For example, the gate electrodes 112 and 113 of the transistors Tr6 and Tr7 are formed on a surface on the semiconductor substrate 11 side of the multilayer wiring layer 12, and active layers and source/drain layers 114 of the transistors Tr6 and Tr7 are formed in a p-type semiconductor well region of a surface layer of the surface S2 of the semiconductor substrate 11. In this case, the source/drain layer 114 is shared between the amplification transistor Tr6 and the selection transistor Tr7. It is to be noted that these transistors Tr5 to Tr7 may be shared between pixels (for example, between adjacent pixels).

On the other hand, the reset transistor Tr5 may be provided, for example, below the transistors Tr6 and Tr7 in the multilayer wiring layer 12.

The reset transistor Tr5 includes an active layer (an active layer 21C) containing a wide gap semiconductor, as with the transfer transistor Tr1 of the above-described first embodiment. More specifically, the reset transistor Tr5 includes the wide gap semiconductor layer 21 provided in the multilayer wiring layer 12 and the gate electrode 111 disposed to face a part of the wide gap semiconductor layer 21. The part facing the gate electrode 111 of the wide gap semiconductor layer 21 functions as the active layer 21C, and the source/drain layers 21A and 21B are formed adjacent to this active layer 21C.

The wide gap semiconductor layer 21 may be made of a similar oxide semiconductor to that of the wide gap semiconductor layer 13 of the above-described first embodiment.

The following merits are obtained by forming, below the surface S2 (the circuit formation surface) of the semiconductor substrate 11, the reset transistor Tr5 formed with use of the wide gap semiconductor in the above-described manner. More specifically, even in a case where the photodiodes 11B and 11R are formed in the semiconductor substrate 11 as with this embodiment, the reset transistor Tr5 is less likely to serve as shielding of light entering the photodiodes 11B and 11R. Therefore, for example, as illustrated in FIG. 12, the reset transistor Tr5 may be provided to be superimposed on the photodiodes 11B and 11R (in a region facing the photodiodes 11B and 11R). Therefore, the shape, size, and layout of the rest transistor Tr5 may be freely designed irrespective of the layout of the photodiodes 11B and 11R. For example, as illustrated in FIG. 13, a reset transistor with a large gate length b is allowed to be formed without being limited by a unit pixel P, and flexibility of transistor design such as suppression of a short channel effect is enhanced.

Moreover, light in the short wavelength region is absorbed by the organic photoelectric conversion layer 15 before reaching the wide gap semiconductor layer 21; therefore, variation in characteristics of the reset transistor Tr5 in response to light application is suppressed. In particular, even light in an ultraviolet region shorter than 400 nm is absorbed by the semiconductor substrate 11; therefore, a configuration resistant to deterioration in the wide gap semiconductor is obtained.

[Action and Effects]

In the above-described solid-state image pickup unit 2, when light enters the photoelectric conversion device 10a from the upper electrode 16, a part (for example, green light) of the entered light is detected (absorbed) by the organic photoelectric conversion layer 15, as with the above-described first embodiment. Therefore, in the organic photoelectric conversion layer 15, an electron-hole pair is generated, and one electric charge (for example, an electron) of the electron-hole pair is extracted from the lower electrode 20. On the other hand, light not absorbed by the organic photoelectric conversion layer 15 (blue light and red light) is sequentially absorbed by the photodiodes 11B and 11R in the semiconductor substrate 11, and photoelectric conversion is performed on the light.

More specifically, in an electric charge storage state (a state in which the reset transistor Tr5 is off), the lower electrode 20 is reset to a predetermined voltage, and a relatively low voltage with respect to the reset voltage is applied to the upper electrode 16. Therefore, the electron of the electron-hole pair generated in the organic photoelectric conversion layer 15 is guided to the lower electrode 20 that has a relatively high potential (a hole is guided to the upper electrode 16). At this time, the gate electrode 112 of the amplification transistor Tr6 is in a so-called floating state.

In this embodiment, since the lower electrode 20 is connected to the gate electrode 112 of the amplification transistor Tr6, in the electric charge storage state, the electron generated in the organic photoelectric conversion layer 15 is stored in the gate electrode 112 of the amplification transistor Tr6 through the lower electrode 20, the wiring line 121A, the conductive plug 121B, and the wiring line 121C.

After that, during a reading operation, the stored electric charge is read to the vertical signal line Lsig that will be described later through the amplification transistor Tr6, the selection transistor Tr7, and the like.

After the reading operation, when the reset transistor Tr5 is turned on, the gate electrode 112 of the amplification transistor Tr3 may be reset to, for example, the power supply voltage VDD. After that, when the reset transistor Tr5 is turned off, the state is transitioned to the above-described electric charge storage state. As described above, a voltage signal, based on, for example, green light is obtained from the photoelectric conversion device 10a.

However, in this embodiment, since a transfer gate is not provided (a portion corresponding to a floating diffusion is not provided), it may be desirable to remove reset noise in the following manner. Namely, it may be desirable that a signal immediately after resetting of the gate electrode 112 be held in a memory or the like, and a difference between the signal immediately after the resetting and a signal at completion of electric charge storage be obtained.

On the other hand, electric charges, based on blue light and red light on which photoelectric conversion has been performed by the photodiodes 11B and 11R are transferred to a floating diffusion through transfer gates (the gate electrodes 115 and 116). After that, the electric charges are read to the vertical signal line Lsig that will be described later through an unillustrated amplification transistor, an unillustrated selection transistor, and the like. Thus, for example, voltage signals, based on blue light and red light may be obtained from the photodiodes 11B and 11R.

In this case, in this embodiment, as described above, the lower electrode 20 of the photoelectric conversion device 10a is connected to the gate electrode 112 of the amplification transistor Tr6, and is connected to the source 21A of the reset transistor Tr5. Therefore, a pn junction is not formed in a transmission path of an electric charge extracted from the photoelectric conversion device 10a, and as with the above-described first embodiment, generation of a dark current caused by a depletion layer is suppressed.

Moreover, since the reset transistor Tr5 includes the active layer 21C containing the wide gap semiconductor (for example, an oxide semiconductor), as with the case of the above-described transfer transistor Tr1, generation of a dark current caused by the hole-electron pair in the reset transistor Tr5 and a dark current caused by a diffusion current from below the gate electrode 111 is suppressed.

As described above, in this embodiment, in a configuration in which the photoelectric conversion device 10a is provided on the surface S1 of the semiconductor substrate 11, the lower electrode 20 of the photoelectric conversion device 10a is connected to the gate electrode 112 of the amplification transistor Tr6, and is connected to the source 21A of the reset transistor Tr5. Therefore, a pn junction is not formed in an electric charge transmission path (at least a path from the lower electrode 20 to the floating diffusion), and generation of a dark current caused by a depletion layer at a pn junction interface is allowed to be suppressed. Moreover, since the active layer 21C of the reset transistor Tr5 contains the wide gap semiconductor, generation of a dark current caused by a minority electric charge generated in the reset transistor Tr5 or a diffusion current is allowed to be suppressed. Therefore, similar effects to those in the above-described first embodiment are allowed to be obtained.

Next, modification examples (Modification Examples 4 to 6) of the solid-state image pickup unit 2 of the above-described second embodiment will be described below. In the following description, like components are denoted by like numerals as of the above-described embodiments and the like and will not be further described.

Modification Example 4

FIG. 14 schematically illustrates a sectional configuration of a solid-state image pickup unit according to Modification Example 4. In the above-described second embodiment, the wide gap semiconductor layer 21 has a configuration resistant to light application by adopting a back-side illumination configuration; however, in a case of a front-side illumination configuration such as this modification example, a light-shielding layer 22 may be desirably provided.

The light-shielding layer 22 is provided above the wide gap semiconductor layer 21 but below the organic photoelectric conversion layer 15. Examples of a material of the light-shielding layer 22 may include a similar material to that of the light-shielding layer 17 of the above-described Modification Example 1. Even in such a configuration, variation in transistor characteristics by light application to the wide gap semiconductor layer 21 is allowed to be suppressed. Moreover, flexibility of layout design of the reset transistor Tr5 is enhanced. Therefore, similar effects to those in the above-described second embodiment are allowed to be obtained.

It is to be noted that, depending on the intended use, such a light-shielding layer 22 may not provided, and the lower electrode 20 may have a light-shielding effect with use of a metal material or the like. Alternatively, an effect of reducing light application to the wide gap semiconductor layer 21 is allowed to be obtained by forming the organic photoelectric conversion layer 15 to cover a region facing the wide gap semiconductor layer 21.

Modification Example 5

FIG. 15 schematically illustrates a sectional configuration of a solid-state image pickup unit according to Modification Example 5. A light-shielding layer 23 may be provided on the upper electrode 16 in such a manner. Examples of a material of the light-shielding layer 23 may include a similar material to that of the light-shielding layer 17 of the above-described Modification Example 1. Even in such a configuration, variation in transistor characteristics caused by light application to the wide gap semiconductor layer 21 is allowed to be suppressed. Moreover, flexibility of layout design of the reset transistor Tr5 is enhanced.

Modification Example 6

FIG. 16 schematically illustrates a sectional configuration of a solid-state image pickup unit according to Modification Example 6. For example, a UV-cut filter 24 configured to block ultraviolet radiation (UV) may be provided on a light incident side of the photoelectric conversion device 10a in such a manner. Even in such a configuration, variation in transistor characteristics by light application to the wide gap semiconductor layer 21 is allowed to be suppressed. Moreover, flexibility of layout design of the reset transistor Tr5 is enhanced.

Modification Example 7

FIG. 17 schematically illustrates a sectional configuration of a solid-state image pickup unit according to Modification Example 7. In the above-described second embodiment, only the reset transistor Tr5 of the three transistors Tr5 to Tr7 is formed of the wide gap semiconductor; however, all of the three transistors Tr5 to Tr7 may be formed of the wide gap semiconductor.

More specifically, the wide gap semiconductor 25 may be provided in, for example, the multilayer wiring layer 12, and the wide gap semiconductor layer 25 may be configured to include the active layers and sources/drains of the reset transistor Tr5, the amplification transistor Tr6, and the selection transistor Tr7.

More specifically, as with the above-described second embodiment, the reset transistor Tr5 includes the wide gap semiconductor layer 25 and the gate electrode 11 facing a part of the wide gap semiconductor layer 25. The part facing the gate electrode 111 of the wide gap semiconductor layer 25 functions as an active layer C5 (corresponding to the active layer 21C), and, for example, a source 25A may be formed adjacent to the active layer C5. The wide gap semiconductor layer 25 is made of a similar material to that of the wide gap semiconductor layer 13 of the above-described first embodiment.

In this modification example, the gate electrodes 112 and 113 of the amplification transistor Tr6 and the selection transistor Tr7 are provided to face a part of the wide gap semiconductor layer 25. The wide gap semiconductor layer 25 includes the active layer C6 of the amplification transistor Tr6 and the active layer C7 of the selection transistor Tr7 in order from the reset transistor Tr5. The active layers C6 and C7 are so formed as to face the gate electrodes 112 and 113, respectively.

Even in such a wide gap semiconductor layer 25, the source 25A of the reset transistor Tr5 is connected to the lower electrode 20, and is connected to the gate electrode 112 of the amplification transistor Tr6 through the wiring line 121D. A region between the active layers C5 and C6 may serve as, for example, a drain d4 shared between the reset transistor Tr5 and the amplification transistor Tr6. A region between the active layers C6 and C7 may serve as, for example, a source/drain d5 shared between the amplification transistor Tr6 and the selection transistor Tr7. The source d6 of the selection transistor Tr7 is connected to the vertical signal line Lsig through the wiring line 121E.

Like this modification example, in a 3Tr configuration, all of the three transistors Tr5 to Tr7 may be formed with use of the wide gap semiconductor, and even in this case, similar effects to those in the above-described second embodiment are allowed to be obtained.

It is to be noted that, in this modification example, a configuration in which all of the three transistors Tr5 to Tr7 are formed with use of the wide gap semiconductor is exemplified; however, the modification example is not limited thereto, and two of the three transistors may be formed with use of the wide gap semiconductor. For example, a configuration in which the reset transistor Tr5 and the amplification transistor Tr6 are formed of the wide gap semiconductor, and the selection transistor Tr7 is formed on the circuit formation surface of the semiconductor substrate 11 may be adopted.

Moreover, the solid-state image pickup units having the 3Tr configurations described in the above-described second embodiment and Modification Examples 4 to 7 are applicable to both the front-side illumination configuration and the back-side illumination configuration. Moreover, the solid-state image pickup unit may be any laminated solid-state image pickup unit such as a longitudinal spectral solid-state image pickup unit and a solid-state image pickup unit in which photoelectric conversion devices of a plurality of colors are two-dimensionally arranged (for example, in a Bayer arrangement) on the semiconductor substrate 11. However, in a back-side illumination solid-state image pickup unit with a two-dimensional arrangement, the effect of suppressing light application to the reset transistor Tr5 and an effect of improving flexibility of layout as described above are allowed to be used more effectively.

Application Example 1

FIG. 18 illustrates an entire configuration of an apparatus using, as each pixel, any of the solid-state image picklpu units (the solid state image pickup units 1 and 2) described in the above-described first and second embodiments, the above-described Modification Examples 1 to 7, and the like. Thus, the solid-state image pickup units 1 and 2 (hereinafter, description will be given with use of the solid-state image pickup unit 1 as an example) may include the pixel section 1a as an image pickup area on the semiconductor substrate 11, and a peripheral circuit section 130 configured of, for example, a row scanning section 131, a horizontal selection section 133, a horizontal selection section 134, and a system control section 132 in a peripheral region of the pixel section 1a.

The pixel section 1A may include, for example, a plurality of unit pixels P (each corresponding to the solid-state image pickup unit 1) that are two-dimensionally arranged in a matrix form. Respective pixel drive lines Lread (more specifically, row selection lines and reset control lines) may be wired to, for example, respective pixel rows of the unit pixels P, and respective vertical signal lines Lsig may be wired to respective pixel columns of the unit pixels P. The pixel drive lines Lread each are configured to transmit a drive signal for signal reading from the pixel. An end of each of the pixel drive lines Lread is connected to an output end corresponding to each of the pixel rows of the row scanning section 131.

The row scanning section 131 is configured of a shift register, an address decoder, and the like, and may be, for example, a pixel drive section that drives respective pixels P of the pixel section 1a from one row to another. Signals outputted from the respective pixels P in a pixel row selected and scanned by the row scanning section 131 are supplied to the horizontal selection section 133 through the respective vertical signal lines Lsig. The horizontal selection section 133 may be configured of an amplifier, a horizontal selection switch, and the like provided to each of the vertical signal lines Lsig.

The horizontal selection section 134 is configured of a shift register, an address decoder, and the like, and is configured to sequentially drive respective horizontal selection switches of the horizontal selection section 133 while scanning the horizontal selection switches. Signals of the respective pixels P transmitted through the respective vertical signal lines Lsig are sequentially outputted to a horizontal signal line 135 by selection scanning by the horizontal selection section 134, and are transmitted to the outside of the substrate 11 through the horizontal signal line 135.

A circuit portion configured of the row scanning section 131, the horizontal selection section 133, the horizontal selection section 134, and the horizontal signal line 135 may be formed directly above the substrate 11, or may be disposed in an external control IC. Alternatively, the circuit portion may be formed on another substrate connected by a cable or the like.

The system control section 132 is configured to receive a clock supplied from the outside, data indicating an operation mode, and the like, and to output data such as internal information of the solid-state image pickup unit 1. The system control section 132 further includes a timing generator configured to generate various kinds of timing signals, and performs drive control on peripheral circuits such as the row scanning section 131, the horizontal selection section 133, and the horizontal selection section 134 in response to the various kinds of timing signals generated by the timing generator.

Application Example 2

The above-described solid-state image pickup unit 1 is applicable to all kinds of electronic apparatuses having an image pickup function, for example, camera systems such as digital still cameras and video cameras, and mobile phones having an image pickup function. FIG. 19 illustrates a schematic configuration of an electronic apparatus 3 (a camera) as an example. The electronic apparatus 3 may be, for example, a video camera allowing for shooting of a still image or a moving image, and includes the image pickup unit 1, an optical system (an optical lens) 310, a shutter unit 311, a drive section 313 configured to drive the solid-state image pickup unit 1 and the shutter unit 311, and a signal processing section 312.

The optical system 310 is configured to guide image light (entering light) from a subject to the pixel section 1a of the image pickup unit 1. The optical system 310 may include a plurality of optical lenses. The shutter unit 311 is configured to control a light irradiation period and a light-shielding period for the image pickup unit 1. The drive section 313 is configured to control a transfer operation of the solid-state image pickup unit 1 and a shutter operation of the shutter unit 311. The signal processing section 312 is configured to perform various kinds of signal processing on a signal outputted from the solid-state image pickup unit 1. An image signal Dout that has been subjected to signal processing may be stored in a storage medium such as a memory, or may be outputted to a monitor or the like.

Although the present disclosure is described referring to the above-described embodiments and the modification examples, the present disclosure is not limited thereto, and various modifications are possible. For example, in the above-described embodiments and the like, a case where, in the photoelectric conversion device formed on the semiconductor substrate 11, the lower electrodes of respective pixels are so provided as to be isolated from one another, and a signal charge is read from each of the lower electrodes is described as an example; however, the present disclosure is not limited thereto, and a configuration in which the upper electrodes 16 of respective pixels are so provided as to be isolated from one another, and signal charges are read from the upper electrodes 16 may be adopted.

Moreover, in the above-described embodiments and the like, a case where an electron of the electron-hole pair generated in the photoelectric conversion device is extracted as a signal charge is described as an example, however, the present disclosure is not limited thereto, and a hole may be extracted as a signal charge.

Further, in the above-described embodiments and the like, as long as the solid-state image pickup unit is a laminated solid-state image pickup unit configured by forming the photoelectric conversion device on the semiconductor substrate, the solid-state image pickup unit may be a longitudinal spectral solid-state image pickup unit or may be a solid-state image pickup unit in which photoelectric conversion devices of respective colors are two-dimensionally arranged in a Bayer arrangement or the like. Furthermore, as the longitudinal spectral solid-state image pickup unit, a case where green light is detected by the photoelectric conversion device 10a on the semiconductor substrate 11 and the blue light and red light are detected by the photodiodes 11B and 11R in the semiconductor substrate 11, respectively is described in the above-described second embodiment, however, the present disclosure is not limited thereto. Namely, two or more kinds of photoelectric conversion devices configured to perform photoelectric conversion on wavelengths different from one another may be laminated on the semiconductor substrate 11, or one kind or three or more kinds of photodiodes may be formed in the semiconductor substrate 11.

It is to be noted that the present disclosure may have the following confirmations.

(1) A solid-state image pickup unit including:
a substrate made of a first semiconductor;
a photoelectric conversion device provided on the substrate and including a first electrode, a photoelectric conversion layer, and a second electrode in order from the substrate; and
a plurality of field-effect transistors configured to perform signal reading from the photoelectric conversion device,
in which the plurality of transistors include a transfer transistor and an amplification transistor,
the transfer transistor includes an active layer containing a second semiconductor with a larger band gap than that of the first semiconductor, and
one terminal of a source and a drain of the transfer transistor also serves the first electrode or the second electrode of the photoelectric conversion device, and the other terminal of the transfer transistor is connected to a gate of the amplification transistor.

(2) The solid-state image pickup unit according to (1), in which
the transfer transistor includes a wide gap semiconductor layer containing the second semiconductor, and a gate electrode disposed to face a part of the wide gap semiconductor layer, and
the part facing the gate electrode of the wide gap semiconductor layer functions as the active layer, and the wide gap semiconductor layer includes a region located adjacent to the active layer and functioning as the source and the first electrode and a region functioning as the drain and a floating diffusion.

(3) The solid-state image pickup unit according to (2), in which the amplification transistor is provided on a circuit formation surface of the substrate.

(4) The solid-state image pickup unit according to (2) to (3), in which
the plurality of transistors further include a rest transistor and a selection transistor,
a source or a drain of the reset transistor is connected to one terminal of a source and a drain of the amplification transistor, and
a source or a drain of the selection transistor is connected to the other terminal of the source and the drain of the amplification transistor.

(5) The solid-state image pickup unit according to (4), in which the wide gap semiconductor layer further includes a portion functioning as active layers, sources, and drains of the reset transistor, the amplification transistor, and the selection transistor.

(6) The solid-state image pickup unit according to any one of (1) to (5), in which
the first semiconductor is silicon, and
the second semiconductor is an oxide semiconductor including one or more kinds selected from indium (In), gallium (Ga), and zinc (Zn).

(7) The solid-state image pickup unit according to (6), in which the photoelectric conversion layer is provided to cover a formation region of the wide gap semiconductor layer.

(8) The solid-state image pickup unit according to (6) or (7), in which a light-shielding layer made of a material different from that of the photoelectric conversion layer is provided above the wide gap semiconductor layer in a region other than a light reception region of the photoelectric conversion device.

(9) The solid-state image pickup unit according to any one of (6) to (8), in which an ultraviolet-cut filter is provided on a light incident side.

(10) A solid-state image pickup unit including:
a substrate made of a first semiconductor;
a photoelectric conversion device provided on the substrate and including a first electrode, a photoelectric conversion layer, and a second electrode in order from the substrate; and
a plurality of field-effect transistors configured to perform signal reading from the photoelectric conversion device,
in which the plurality of transistors include a reset transistor and an amplification transistor,
the reset transistor includes an active layer containing a second semiconductor with a larger band gap than that of the first semiconductor, and
the first electrode or the second electrode of the photoelectric conversion device is connected to one terminal of a source and a drain of the reset transistor, and is connected to a gate of the amplification transistor.

(11) The solid-state image pickup unit according to (10), in which the reset transistor includes a wide gap semiconductor layer containing the second semiconductor, and a gate electrode disposed to face a part of the wide gap semiconductor layer.

(12) The solid-state image pickup unit according to (11), in which the amplification transistor is provided on a circuit formation surface of the substrate.

(13) The solid-state image pickup unit according to (11) or (12), in which
the plurality of transistors further include a selection transistor, and
a source or a drain of the selection transistor is connected to a source or a drain of the amplification transistor.

(14) The solid-state image pickup unit according to (13), in which the wide gap semiconductor layer further includes a portion functioning as active layers, sources, and drains of the amplification transistor and the selection transistor.

(15) The solid-state image pickup unit according to any one of (10) to (14), in which
the first semiconductor is silicon, and
the second semiconductor is an oxide semiconductor including one or more kinds selected from indium (In), gallium (Ga), and zinc (Zn).

(16) The solid-state image pickup unit according to (15), in which the photoelectric conversion layer is provided to cover a formation region of the wide gap semiconductor layer.

(17) The solid-state image pickup unit according to (15) or (16), in which a light-shielding layer made of a material different from that of the photoelectric conversion layer is provided above the wide gap semiconductor layer in a region other than a light reception region of the photoelectric conversion device.

(18) The solid-state image pickup unit according to any one of (15) to (17), in which an ultraviolet-cut filter is provided on a light incident side.

(19) An electronic apparatus provided with a solid-state image pickup unit, the solid-state image pickup unit including:
a substrate made of a first semiconductor;
a photoelectric conversion device provided on the substrate and including a first electrode, a photoelectric conversion layer, and a second electrode in order from the substrate; and
a plurality of field-effect transistors configured to perform signal reading from the photoelectric conversion device,
in which the plurality of transistors include a transfer transistor and an amplification transistor,
the transfer transistor includes an active layer containing a second semiconductor with a larger band gap than that of the first semiconductor, and
one terminal of a source and a drain of the transfer transistor also serves the first electrode or the second electrode of the photoelectric conversion device, and the other terminal of the transfer transistor is connected to a gate of the amplification transistor.

(20) An electronic apparatus provided with a solid-state image pickup unit, the solid-state image pickup unit including:
a substrate made of a first semiconductor;
a photoelectric conversion device provided on the substrate and including a first electrode, a photoelectric conversion layer, and a second electrode in order from the substrate; and
a plurality of field-effect transistors configured to perform signal reading from the photoelectric conversion device,
in which the plurality of transistors include a reset transistor and an amplification transistor,
the reset transistor includes an active layer containing a second semiconductor with a larger band gap than that of the first semiconductor, and
the first electrode or the second electrode of the photoelectric conversion device is connected to one terminal of a source and a drain of the reset transistor, and is connected to a gate of the amplification transistor.

The present disclosure contains subject matter related to that disclosed in Japanese Priority Patent Application No. 2013-5274 filed in the Japan Patent Office on Jan. 16, 2013, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A light detecting device, comprising:
a photoelectric conversion layer disposed above a semiconductor substrate;
a first electrode disposed above the photoelectric conversion layer;
a second electrode disposed between the photoelectric conversion layer and the semiconductor substrate;
an oxide semiconductor layer disposed between the photoelectric conversion layer and the second electrode; and
an amplification transistor disposed at a first surface of the semiconductor substrate, a gate electrode of the amplification transistor being connected to the oxide semiconductor layer,
wherein the oxide semiconductor layer comprises a first portion configured to store electric charge generated in the photoelectric conversion layer, and
wherein the second electrode is electrically isolated from the oxide semiconductor layer and configured to transfer the electric charge stored in the first portion of the oxide semiconductor layer.

2. The light detecting device according to claim 1, wherein the photoelectric conversion layer overlaps the oxide semiconductor layer in a plan view.

3. The light detecting device according to claim 1, wherein the oxide semiconductor layer overlaps the second electrode in a plan view.

4. The light detecting device according to claim 1, wherein the oxide semiconductor layer is disposed closer to the photoelectric conversion layer than to the first electrode.

5. The light detecting device according to claim 1, wherein the oxide semiconductor layer comprises one or more kinds of indium, zinc, and gallium.

6. The light detecting device according to claim 1, wherein the oxide semiconductor layer comprises a second portion configured to receive the electric charge stored in the first portion.

7. The light detecting device according to claim 1, wherein a second surface of the semiconductor substrate is between the photoelectric conversion layer and the first surface of the semiconductor substrate.

8. The light detecting device according to claim 1, further comprising a reset transistor at the first surface of the semiconductor substrate, one of a source and a drain of the reset transistor being connected to the oxide semiconductor layer.

9. The light detecting device according to claim 8, wherein the one of the source and the drain of the reset transistor and the gate electrode of the amplification transistor are connected to the oxide semiconductor layer through a wiring line.

10. The light detecting device according to claim 1, further comprising at least one photodiode disposed in the semiconductor substrate.

11. The light detecting device according to claim 10, wherein the at least one photodiode overlaps the photoelectric conversion layer in a plan view.

12. The light detecting device according to claim 1, wherein the semiconductor substrate is made of a first semiconductor and the oxide semiconductor layer is made of a second semiconductor with a larger band gap than that of the first semiconductor.

13. The light detecting device according to claim 1, the photoelectric conversion layer is an organic photoelectric conversion layer.

14. The light detecting device according to claim 1, further comprising:
a wiring layer between the photoelectric conversion layer and the semiconductor substrate, wherein the oxide semiconductor layer is disposed in an opening of the wiring layer.

15. The light detecting device according to claim 14, wherein the second electrode is disposed in the wiring layer.

16. The light detecting device according to claim 15, wherein the oxide semiconductor layer comprises a second portion configured to receive the electric charge transferred from the first portion by the second electrode.

17. An electronic apparatus comprising:
an optical lens;
a signal processor; and
a light detecting device, comprising:
a photoelectric conversion layer disposed above a semiconductor substrate;
a first electrode disposed above the photoelectric conversion layer;
a second electrode disposed between the photoelectric conversion layer and the semiconductor substrate;
an oxide semiconductor layer disposed between the photoelectric conversion layer and the second electrode; and
an amplification transistor disposed at a first surface of the semiconductor substrate, a gate electrode of the amplification transistor being connected to the oxide semiconductor layer,
wherein the oxide semiconductor layer comprises a first portion configured to store electric charge generated in the photoelectric conversion layer, and
wherein the second electrode is electrically isolated from the oxide semiconductor layer and configured to transfer the electric charge stored in the first portion of the oxide semiconductor layer.

* * * * *